un011437908B2

United States Patent
Li et al.

(10) Patent No.: US 11,437,908 B2
(45) Date of Patent: Sep. 6, 2022

(54) VOLTAGE REGULATOR GENERATING AN OUTPUT VOLTAGE ACCORDING TO A COUPLED LOAD UNIT

(71) Applicant: Shanghai Zhaoxin Semiconductor Co., Ltd., Shanghai (CN)

(72) Inventors: Guofeng Li, Beijing (CN); Zhongding Liu, Beijing (CN); Shen Li, Shanghai (CN); Fan Jiang, Beijing (CN)

(73) Assignee: SHANGHAI ZHAOXIN SEMICONDUCTOR CO., LTD., Shanghai (CN)

( * ) Notice: Subject to any disclaimer, the term of this patent is extended or adjusted under 35 U.S.C. 154(b) by 112 days.

(21) Appl. No.: 17/091,295

(22) Filed: Nov. 6, 2020

(65) Prior Publication Data

US 2022/0115949 A1    Apr. 14, 2022

(30) Foreign Application Priority Data

Oct. 13, 2020   (CN) .......................... 202011088618.X

(51) Int. Cl.
*H02M 3/157*   (2006.01)
*H02M 3/158*   (2006.01)
*H03K 19/21*   (2006.01)

(52) U.S. Cl.
CPC ......... *H02M 3/157* (2013.01); *H02M 3/1584* (2013.01); *H03K 19/21* (2013.01)

(58) Field of Classification Search
None
See application file for complete search history.

(56) References Cited

U.S. PATENT DOCUMENTS

| | | | | |
|---|---|---|---|---|
| 9,024,606 | B2 * | 5/2015 | Adell | H02M 3/1588 323/283 |
| 9,281,745 | B2 * | 3/2016 | Zoso | H02M 3/157 |
| 9,748,835 | B2 * | 8/2017 | Braun | H02M 1/4225 |
| 9,800,145 | B2 * | 10/2017 | Sasaki | H02M 3/156 |
| 9,812,960 | B2 | 11/2017 | Kunz et al. | |
| 10,079,540 | B2 * | 9/2018 | Leisten | H02M 3/158 |
| 10,511,234 | B2 | 12/2019 | Zhang et al. | |

FOREIGN PATENT DOCUMENTS

| | | |
|---|---|---|
| CN | 106033930 A | 10/2016 |
| CN | 106936307 A | 7/2017 |
| CN | 106992672 A | 7/2017 |

(Continued)

OTHER PUBLICATIONS

Chinese language office action dated Oct. 9, 2021, issued in application No. CN 202011088618.X.

(Continued)

*Primary Examiner* — Jeffrey A Gblende
(74) *Attorney, Agent, or Firm* — McClure, Qualey & Rodack, LLP

(57) ABSTRACT

A voltage regulator includes a first control circuit and a first voltage adjusting circuit. The first control circuit receives an output voltage and generates a first control signal according to the output signal. The first voltage adjusting circuit is coupled to the first control circuit, receives the first control signal, and adjusts the output voltage according to the first control signal.

13 Claims, 19 Drawing Sheets

(56) References Cited

FOREIGN PATENT DOCUMENTS

CN          111208858 A      5/2020
EP          3 373 102 A1     9/2018

OTHER PUBLICATIONS

Lim, C.Y., et al.; "A 50-mA 99.2% Peak Current Efficiency, 250-ns Settling Time Digital Low-Dropout Regulator With Transient Enhanced PI Controller;" IEEE Transactions on Very Large Scale Integration (VLSI) Systems; 2017; pp. 1-11.
Gonzalez, C., et al.; "ISSCC2017-03 Visuals POWER9 TM: A Processor Family Optimized for Cognitive with 25Gb/s Accelerator Links and 16Gb/s PCIe Gen4;" 2017; pp. 1-263.

* cited by examiner

VOLTAGE REGULATOR GENERATING AN OUTPUT VOLTAGE ACCORDING TO A COUPLED LOAD UNIT

CROSS REFERENCE TO RELATED APPLICATIONS

This application claims priority of China Patent Application No. 202011088618.X, filed on Oct. 13, 2020, the entirety of which is incorporated by reference herein.

BACKGROUND OF THE INVENTION

Field of the Invention

The present invention relates to a regulator, and in particular, relates to a voltage regulator.

Description of the Related Art

In general, with the continuous improvement of integrated circuit manufacturing technology, the integration of a load unit, such as a central processing unit (CPU), is increasing. The overall power consumption of the load unit is also increasing.

However, the load unit does not always work in a heavy load state, or not every part of the load unit needs to work in a heavy load state. For example, when multiple cores of a central processing unit work at the same voltage, the above voltage may be limited to a higher value by some cores working at high frequencies, so that the cores working at low frequencies consume a lot of power unnecessarily. Therefore, the above manner of supplying power still needs improvement.

BRIEF SUMMARY OF THE INVENTION

The present invention provides a voltage regulator, thereby providing an appropriate output voltage to a load unit, so as to effectively avoid the problem of power waste and decrease the overall power consumption of the circuit.

The present invention provides a voltage regulator coupled to a load circuit. The output voltage of the voltage regulator is affected by the load unit. The voltage regulator includes a first control circuit and a first voltage adjusting circuit. The voltage regulator generates a first control signal according to the output voltage through the first control circuit, so that the first voltage adjusting circuit adjusts the output voltage to a stable state according to the first control signal.

The present invention provides a voltage regulator coupled to a load circuit, which further includes a second control circuit and a third control circuit. The second control circuit and the third control circuit control the first voltage adjusting circuit to adjust the output voltage, so as to effectively prevent a large undershoot or a large overshoot of the output voltage.

The present invention provides a voltage regulator coupled to a load circuit, which further includes a fourth control circuit and a second voltage adjusting circuit. The fourth control circuit controls the second voltage adjusting circuit to adjust the output voltage, so that when the load unit switches from a light load state to a heavy load state, the fourth control circuit and the second voltage adjusting circuit may effectively prevent the voltage from exceeding the overshoot and undershoot limits, which can result in a breakdown of the load unit. In this way, the ripple of the output voltage is decreased and the stability of the output voltage is increased.

The present invention provides a voltage regulator coupled to a load circuit, which further includes a fifth control circuit. Accordingly, when the load unit is switched from a light load state to a heavy load state, fifth control circuit may effectively prevent the voltage from exceeding the overshoot and undershoot limits, which can result in a breakdown of the central processing unit under a heavy load state. In this way, the ripple of the output voltage is decreased and the stability of the output voltage is increased.

The voltage regulator disclosed by the embodiment of the present invention is suitable to supply power to the load unit that affect the output voltage of the voltage regulator, thereby effectively avoiding the problem of power waste and decreasing the overall power consumption of the circuit.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

In each of the following embodiments, the same reference number represents an element or component that is the same or similar.

Figure 1:
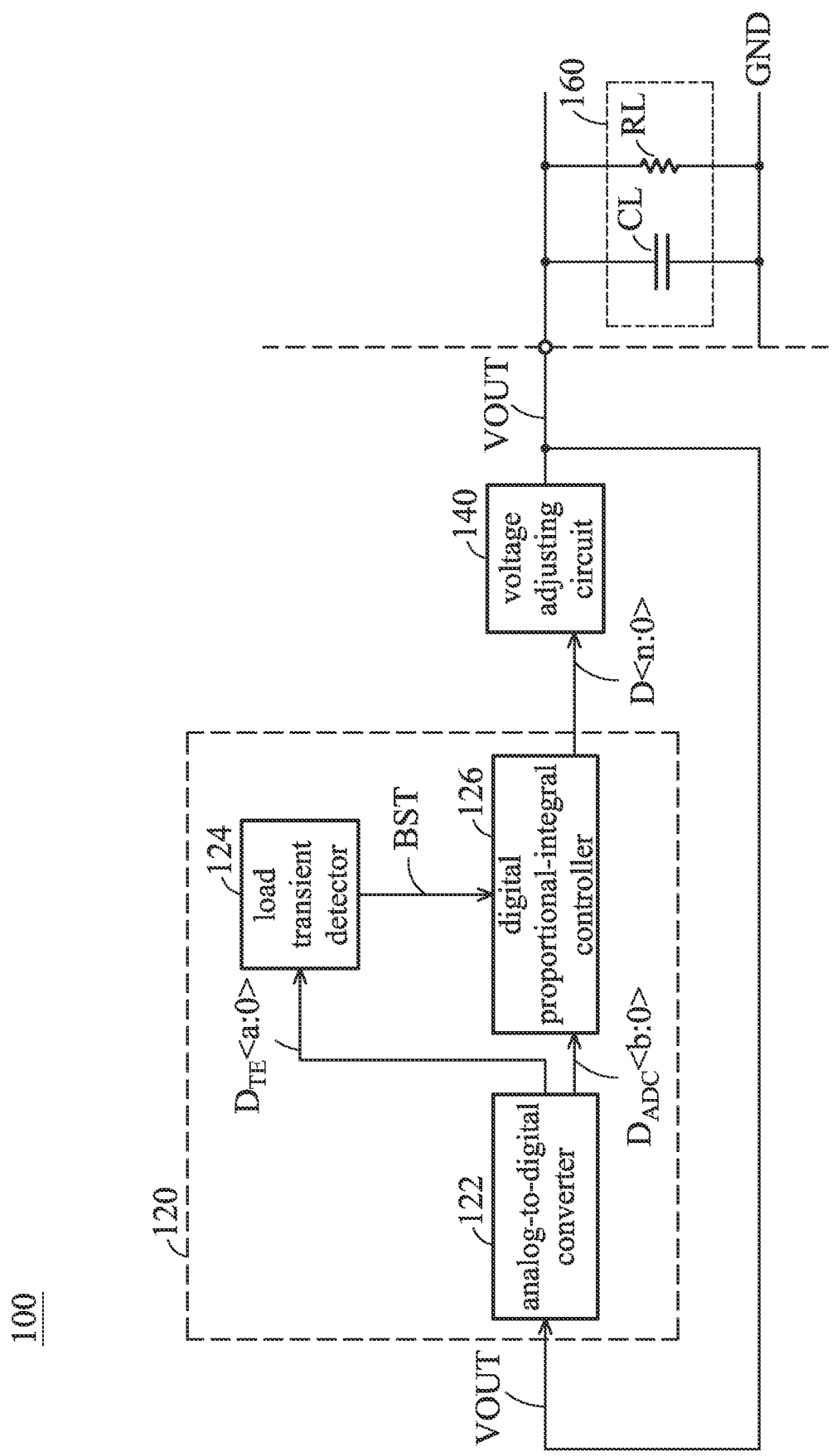
FIG. 1 is a schematic view of a voltage regulator 100 according to an embodiment of the present invention.

FIG. 1 is a schematic view of a voltage regulator 100 according to an embodiment of the present invention. In the embodiment, the voltage regulator 100 coupled to a load unit 160 is configured to provide a stable output voltage VOUT. As shown in FIG. 1, the voltage regulator 100 includes a first control circuit 120 and a voltage adjusting circuit 140.

The voltage adjusting circuit 140 is coupled to the first control circuit 120, receives a first control signal D<n:0>, and adjusts the output voltage VOUT according to the first control signal D<n:0>, wherein n is a positive integer. As shown in FIG. 1, in the embodiment, the output voltage VOUT output by the voltage adjusting circuit 140 is fed back to an input terminal of the first control circuit 120 to serve as an input voltage of the first control circuit 120. The first control circuit 120 receives the output voltage VOUT, and generates the first control signal D<n:0> according to the output voltage VOUT. The first control signal D<n:0> controls a number of conducting transistors in the voltage adjusting circuit 140 to adjust the output voltage VOUT, stabilizing the output voltage VOUT affected by the load unit 160.

The first control circuit 120 includes an analog-to-digital converter (ADC) 122, a load transient detector (LTD) 124 and a digital proportional-integral controller (DPIC) 126. The analog-to-digital converter 122 receives the output voltage VOUT, and performs an analog-to-digital conversion on the output voltage VOUT to generate a first internal control signal $D_{TE}$<a:0> and a binary second internal control signal $D_{ADC}$<b:0>, wherein a and b are positive integers, and the first internal control signal $D_{TE}$<a:0> is thermometer code weighed.

The load transient detector 124 is coupled to the analog-to-digital converter 122, receives the first internal control signal $D_{TE}$<a:0>, and set a detecting signal BST output by the load transient detector 124 to be a corresponding indication value according to the first internal control signal $D_{TE}$<a:0>. When the first internal control signal $D_{TE}$<a:0> is a first value, such as "000", this indicates that the current of the load unit 160 suddenly decreases, herein, the decreasing of the current of the load unit 160 causes the output voltage VOUT to overshoot. When the first internal control signal $D_{TE}$<a:0> is a second value, such as "111", this indicates that the current of the load unit 160 suddenly increases, herein, the increasing of the current of the load unit 160 causes the output voltage VOUT to severely undershoot. In both cases, the detecting signal BST generated by the load transient detector 124 is a first indication value, such as "1". When the first internal control signal $D_{TE}$<a:0> is a third value, such as "001" or "011", this indicates that the output voltage VOUT is stable. The detecting signal BST generated by the load transient detector 124 is a second indication value, such as "0".

The digital proportional-integral controller 126 is coupled to the analog-to-digital converter 122 and the load transient detector 124 to receive the second internal control signal $D_{ADC}$<b:0> and the detecting signal BST respectively. The digital proportional-integral controller 126 performs an proportional-integral operation on the second internal control signal $D_{ADC}$<b:0> according to the detecting signal BST, so as to generate the first control signal D<n:0>. In the embodiment, the detecting signal BST may control a magnitude of a gain term of the digital proportional-integral controller, and the gain term includes a proportional term $K_P$ and an integral term $K_I$.

For example, when the detecting signal BST is the first indication value, such as "1", this indicates that a overshoot or a undershoot exists in the output voltage VOUT, the gain term of the digital proportional-integral controller 126 is increased to suppress the overshoot or the undershoot of the output voltage VOUT. When the detecting signal BST is the second indication value, such as "0", this indicates that there is no overshoot or overshoot exists in the output voltage VOUT, the gain term of the digital proportional-integral controller 126 is decreased to maintain the output voltage VOUT stable. The analog-to-digital converter 122, the load transient detector 124 and the digital proportional-integral controller 126 are described below with reference to FIGS. 2 to 4.

According to another embodiment of the present invention, the first control circuit 120 shown in FIG. 1 further includes a first sign converter (not shown) and a second sign converter (not shown). The connection between the analog-to-digital converter 122 and the digital proportional-integral controller 126 is broken. The first sign converter is coupled to the output terminal of the analog-to-digital converter 122 to receive the second internal control signal $D_{ADC}$<b:0>. The first sign converter adds a sign bit to the second internal control signal $D_{ADC}$<b:0>, and then outputs the second internal control signal $D_{ADC}$<b:0> with the added sign bit to the digital proportional-integral controller 126 to determine the output voltage VOUT will be pulled up or down. The connection between the digital proportional-integral controller 126 and the voltage adjusting circuit 140 is broken. The second sign converter is coupled to the output terminal of the digital proportional-integral controller 126 to receive the first control signal $D_{ADC}$<n:0> with the sign bit. The second sign converter deletes the appendant sign bit of the first control signal $D_{ADC}$<n:0>, and then outputs the first control signal $D_{ADC}$<n:0> without the appendant sign bit to the voltage adjusting circuit 140 to support the operation of the voltage adjusting circuit 140.

Figure 2:
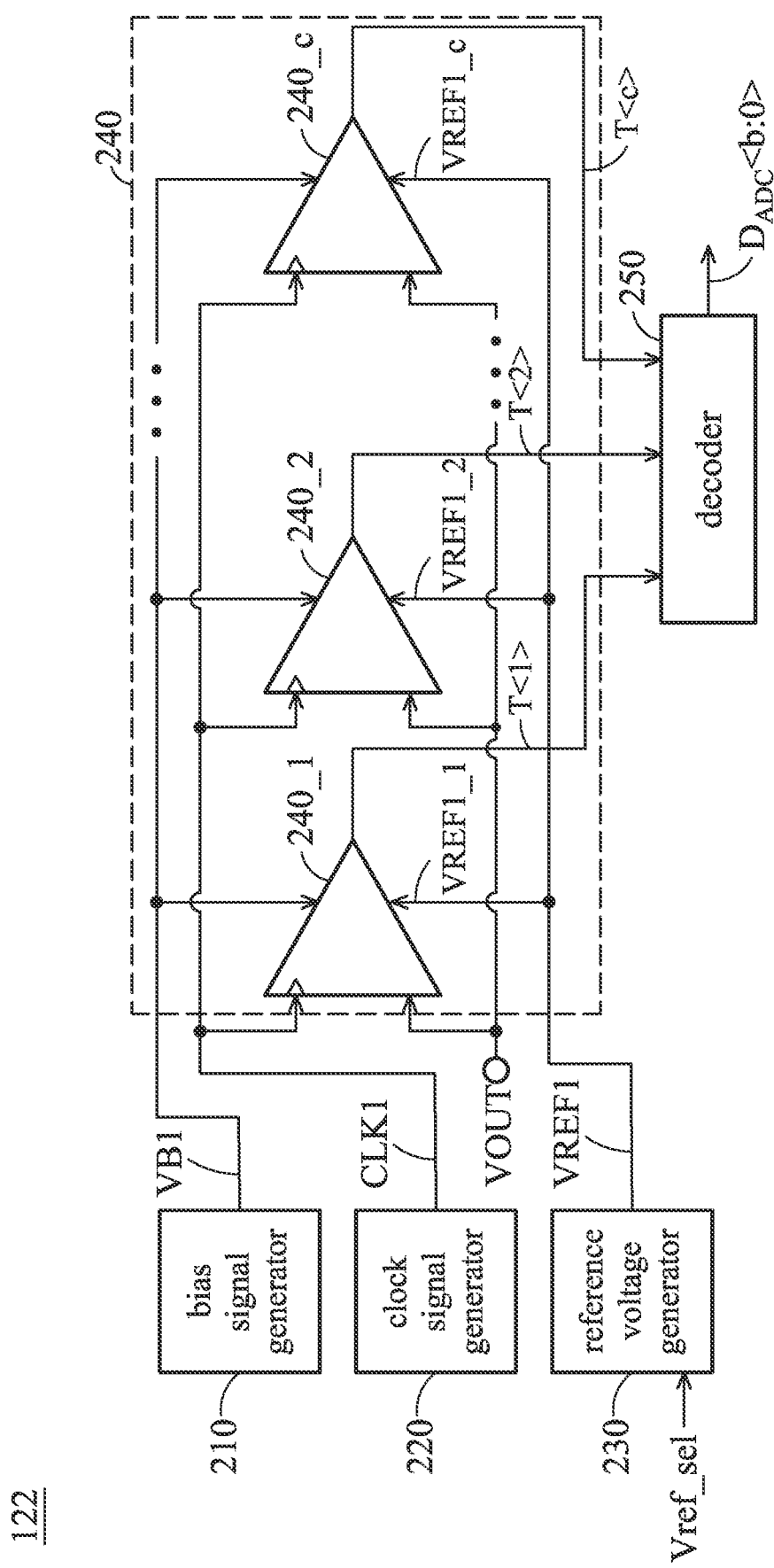
FIG. 2 is a schematic view of an analog-to-digital converter 122 according to an embodiment of the present invention.

FIG. 2 is a schematic view of an analog-to-digital converter 122 according to an embodiment of the present invention. As shown in FIG. 2, the analog-to-digital converter 122 includes a bias signal generator 210, a clock signal generator 220, a reference voltage generator 230, a comparator group 240 and a decoder 250. Herein, the bias signal generator 210 generates a bias signal VB1. The clock signal generator 220 generate a clock signal CLK1. The reference voltage generator 230 generates a reference voltage VREF1 according to a reference voltage selecting signal Vref_sel. The reference voltage VREF1 includes a plurality of sub reference voltages VREF1_1~VREF1_c, herein c is a positive integer.

The comparator group 240 includes comparators 240_1~240_c. Each of the comparators 240_1~240_c includes a first input terminal, a second input terminal, a third input terminal, a fourth input terminal and an output terminal. The first input terminal of each of the comparators 240_1~240_c receives the output voltage VOUT. The second input terminal of each of the comparators 240_1~240_c is coupled to the clock signal generator 220 to receive the clock signal CLK1. The third input terminal of each of the comparators 240_1~240_c is coupled to the bias signal generator 210 to receive the bias signal VB1. The fourth input terminal of each of the comparators 240_1~240_c is coupled to the reference voltage generator 230 to receive a corresponding sub reference voltage of the sub reference voltages VREF1_1~VREF1_c respectively. The comparators 240_1~240_c generate one-bit thermometer codes T<1>~T<c> respectively, herein the one-bit thermometer codes T<1>~T<c> are output from the output terminals of the comparators 240_1~240_c respectively. The decoder 250 is coupled to the output terminals of the comparators 240_1~240_c and receives the thermometer codes T<1>~T<c>. The decoder 250 performs a thermometer-code-to-binary-code conversion on the thermometer codes T<1>~T<c> to generate the binary second internal control signal $D_{ADC}$<b:0>, and the second internal control signal $D_{ADC}$<b:0> is output from an output terminal of the decoder 250. According to an embodiment of the present invention, when the second internal control signal $D_{ADC}$<b:0> with b+1 bits is generated, the positive integer c needs to be at least $2^{b+1}-1$, herein b may be a positive integer, such as 3, 4, 5, etc. When the b is larger, the loop gain of the first control circuit 120 is larger. According to an embodiment of the present invention, the middle bit of the thermometer codes T<1>~T<c> and at least two bits equally spaced before and after the middle bit are used as the first internal control signal $D_{TE}$<a:0> above, wherein a may be an even number, such as 2, 4, 6, etc. When the interval between the middle bit of the thermometer codes T<1>~T<c> and the at least two bits is larger, the sensitivity of the first control circuit 120 is lower. For example, an embodiment of the present invention takes the middle bit of thermometer codes T<1>~T<c>, the adjacent bit before the middle bit and the adjacent bit after the middle bit as a first internal control signal DTE<2:0>. Another embodiment of the present invention takes the middle bit of the thermometer codes T<1>~T<c>, the second bit before the middle bit and the second bit after the middle bit as a first internal control signal DTE<2:0>. Herein, when the interval between the middle bit and the at least two bits is larger, the sensitivity of the first control circuit 120 is lower. Another embodiment of the present invention takes the middle bit of the thermometer codes T<1>~T<c>, the adjacent bit before the middle bit, the second bit before the middle bit, the adjacent bit after the middle bit and the second bit after the middle bit as a first internal control signal DTE<4:0>.

According to another embodiment of the present invention, the analog-to-digital converter 122 don't include at least one of the bias signal generator 210, the clock signal generator 220 and the reference voltage generator 230. The analog-to-digital converter 122 may receive at least one of the bias signal VB1, the clock signal CLK1 and the reference voltage VREF1 from external of the analog-to-digital converter 122.

Figure 3:
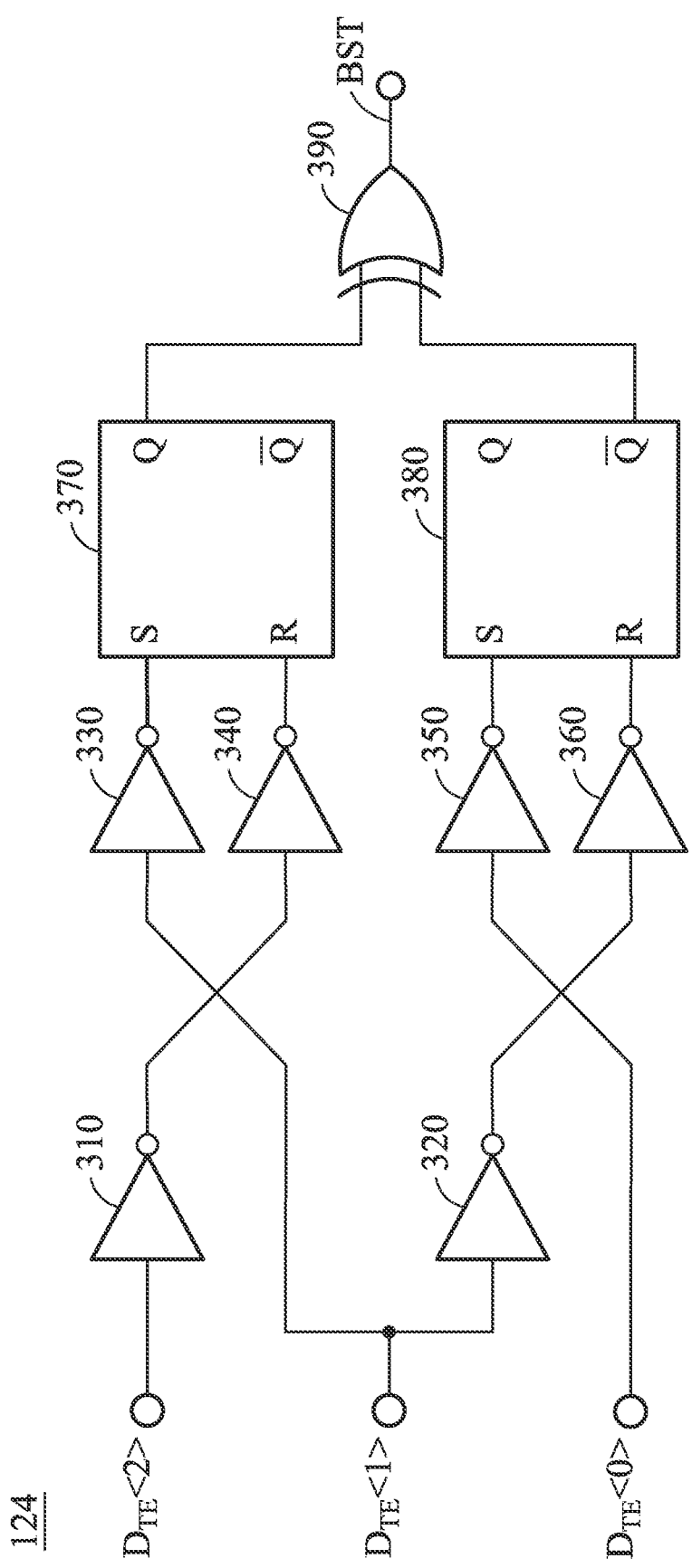
FIG. 3 is a schematic view of a load transient detector 124 according to an embodiment of the present invention.

FIG. 3 is a schematic view of a load transient detector 124 according to an embodiment of the present invention. FIG. 3 illustrates a situation of processing a 3 bit first internal control signal $D_{TE}$<2:0>. Herein, the load transient detector 124 includes an inverter 310, an inverter 320, an inverter 330, an inverter 340, an inverter 350, an inverter 360, a RS flip-flop 370, a RS flip-flop 380 and a XOR gate 390.

The inverter 310 includes an input terminal and an output terminal. The input terminal of the inverter 310 receives a bit signal $D_{TE}$<2> of the first internal control signal $D_{TE}$<2:0>. The inverter 320 includes an input terminal and an output terminal. The input terminal of the inverter 320 receives a bit signal $D_{TE}$<1> of the first internal control signal $D_{TE}$<2:0>. The inverter 330 includes an input terminal and an output terminal. The input terminal of the inverter 330 receives the bit signal $D_{TE}$<1> of the first internal control signal $D_{TE}$<2:0>. The inverter 340 includes an input terminal and an output terminal. The input terminal of the inverter 340 is coupled to the output terminal of the inverter 310 to receive an inverted bit signal $D_{TE}$<2>. The inverter 350 includes an input terminal and an output terminal. The input terminal of the inverter 350 receives a bit signal $D_{TE}$<0> of the first internal control signal $D_{TE}$<2:0>. The inverter 360 includes an input terminal and an output terminal. The input terminal of the inverter 360 is coupled to the output terminal of the inverter 320 to receive an inverted bit signal $D_{TE}$<1>. The RS flip-flop 370 includes a first input terminal, a second input terminal, a first output terminal and a second output terminal. The first input terminal of the RS flip-flop 370 is coupled to the output terminal of the inverter 330 to receive the inverted bit signal $D_{TE}$<1>. The second input terminal of the RS flip-flop 370 is coupled to the output terminal of the inverter 340 to receive a delayed bit signal $D_{TE}$<2>. The RS flip-flop 380 includes a first input terminal, a second input terminal, a first output terminal and a second output terminal. The first input terminal of the RS flip-flop 380 is coupled to the output terminal of the inverter 350 to receive an inverted bit signal $D_{TE}$<0>. The second input terminal of the RS flip-flop 380 is coupled to the output terminal of the inverter 360 to receive a delayed bit signal $D_{TE}$<1>. The XOR gate 390 includes a first input terminal, a second input terminal and an output terminal. The first input terminal of the XOR 390 is coupled to the first output terminal of the RS flip-flop 370. The second input terminal of the XOR gate 390 is coupled to the second output terminal of the RS flip-flop 380. The output terminal of the XOR gate 390 outputs the detecting signal BST.

According to an embodiment of the present invention, if the first internal control signals $D_{TE}$<a:0> includes more than 3 bits, such as, 5 bits or 7 bits, the numbers of inverters and RS flip-flops are increased accordingly. So that, the first bit signal $D_{TE}$<0> of the first internal control signal $D_{TE}$<a:0> is inverted, and the inverted first bit signal $D_{TE}$<0> is provided to the first input terminal of the first RS flip-flop. The second bit signal $D_{TE}$<1> of the first internal control signal $D_{TE}$<a:0> is delayed, and the delayed second bit signal $D_{TE}$<1> is provided to the second input terminal of the first RS flip-flop. The second bit signal $D_{TE}$<1> of the first internal control signal $D_{TE}$<a:0> is inverted, and the inverted second bit signal $D_{TE}$<1> is provided to the first input terminal of the second RS flip-flop. The third bit signal $D_{TE}$<2> of the first internal control signal $D_{TE}$<a:0> is delayed, and the delayed third bit signal $D_{TE}$<2> is provided to the second input terminal of the second RS flip-flop. . . . The a-th bit signal $D_{TE}$<a−1> of the first internal control signal $D_{TE}$<a:0> is inverted, and the inverted a-th bit signal $D_{TE}$<a−1> is provided to the first input terminal of the a-th RS flip-flop. The (a+1)-th bit signal $D_{TE}$<a> of the first internal control signal $D_{TE}$<a:0> is delayed, and the delayed (a+1)-th bit signal $D_{TE}$<a> is provided to the second input terminal of the a-th RS flip-flop. Finally, a XOR gate performs a XOR operation on the output signals of the first to a-th RS flip-flops to generate the detection signal BST.

The load transient detector 124 receives the first internal control signal $D_{TE}$<a:0> from the analog-to-digital converter 122 to generate the detecting signal BST. When the first internal control signal $D_{TE}$<a:0> is the first value, such as "000", or the second value, such as "111", this indicates that the current of the load unit 160 suddenly either decreases or increases, herein, the decreasing or increasing of the current of the load unit 160 causes the output voltage VOUT to either overshoot or undershoot. Accordingly, the load transient detector 124 generates and outputs the detecting signal BST with the first indication value (such as "1"). When the first internal control signal $D_{TE}$<a:0> is the third value, such as "001" or "011", this represents that the output voltage VOUT is stable. Accordingly, the load transient detector 124 generates and outputs the detecting signal BST with the second indication value (such as "0").

Figure 4:
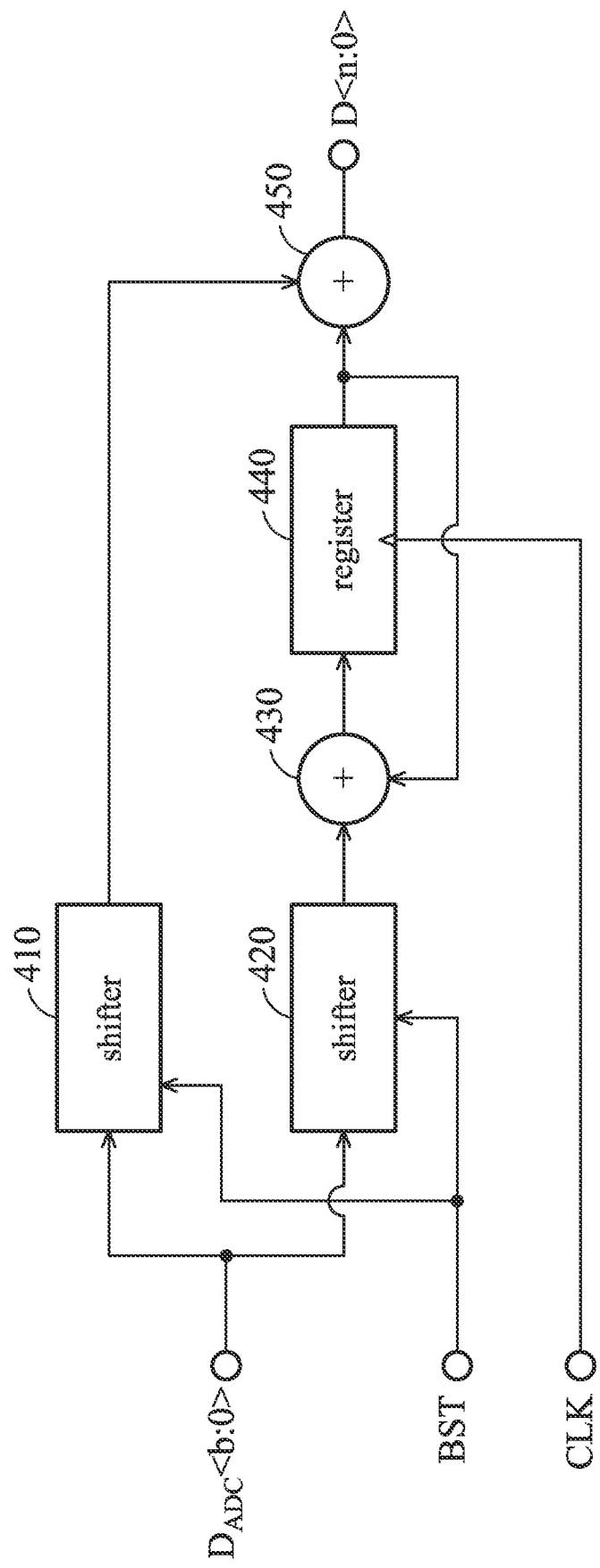
FIG. 4 is a schematic view of a digital proportional-integral controller 126 according to an embodiment of the present invention.

FIG. 4 is a schematic view of a digital proportional-integral controller 126 according to an embodiment of the present invention. As shown in FIG. 4, the digital proportional-integral controller 126 includes a shifter 410, a shifter 420, an adder 430, a register 440 and an adder 450.

The shifter 410 receives the detecting signal BST and the binary second internal control signal $D_{ADC}$<b:0> to generate a first shifting signal, herein the first shifting signal can be represented as $K_P*D_{ADC}$<b:0>. The shifter 410 controls the magnitude of the proportional term $K_P$ of the shifter 410 according the detecting signal BST, causes the second internal control signal $D_{ADC}$<b:0> to be shifted to left or right, herein the proportional term $K_P$ controls the number of shifted bits of the second internal control signal $D_{ADC}$<b:0>. The shifter 420 receives the second internal control signal $D_{ADC}$<b:0> and the detecting signal BST to generate a second shifting signal, herein the second shifting signal can be represented as $K_I*D_{ADC}$<b:0>. The shifter 420 controls the magnitude of the integral term $K_I$ of the shifter 420 according to the detecting signal BST, causes the second internal control signal $D_{ADC}$<b:0> to be shifted to left or right, herein the integral term $K_I$ controls the number of shifted bits of the second internal control signal $D_{ADC}$<b:0>.

The adder 430 is coupled to the shifter 420. A first input terminal of the adder 430 receives the second shifting signal. A second input terminal of the adder 430 receives a first adding signal. In a first clock period of a clock signal CLK, the adder 430 adds the second shifting signal and the first adding signal to generate a second adding signal. The register 440 is coupled to the adder 430. A data input terminal of the register 440 receives the second adding signal. Under the drive of the clock signal CLK in a second clock period, the register 440 feeds the second adding signal back to the second input terminal of the adder 430 to serve as the first adding signal that the adder 430 performs the adding calculation in the second clock period of the clock signal CLK. Before the register 440 outputs the second adding signal under the drive of the clock signal CLK in the second clock period, the adder 450 coupled to the shifter 410 and the register 440 may add the received first shifting signal of the first clock period and the received first adding signal of the first clock period, to generate the first control signal D[d−1] of the first clock period. Herein, the second clock period is a certain clock period of the clock signal CLK, and the first clock period is the previous adjacent clock period of the second clock period of the clock signal CLK. The control signal D[d] of the second clock period may be expressed by the following equation.

$$D[d]=D[d-1]+K_P\{D_{ADC}[d]-D_{ADC}[d-1]\}+K_I D_{ADC}[d-1]$$

Wherein D[d] is the first control signal D<n:0> in the second clock period of the clock signal CLK, D[d−1] is the first control signal D<n:0> in the first clock period of the clock signal CLK, $K_P$ is the proportional term of the shifter 410, $K_I$ is the integral term of the shifter 420, $D_{ADC}$[d] is the second internal control signal $D_{ADC}$<b:0> in the second clock period of the clock signal CLK, and the $D_{ADC}$[d−1] is the second internal clock signal $D_{ADC}$<b:0> in the first clock period of the clock signal CLK.

Specifically, when the detecting signal BST is "0", the shifter 410 and the shifter 420 respectively decrease the proportional term $K_P$ and the integral term $K_I$ according to the detecting signal BST. The shifter 410 and the shifter 420 respectively shift the second internal control signal $D_{ADC}$<0:4> to right, so as to decrease the first control signal D<n:0>. When the detecting signal BST is "1", the shifter 410 and the shifter 420 respectively increase the proportional term $K_P$ and the integral term $K_I$ according to the detecting signal BST. The shifter 410 and the shifter 420 respectively shift the second internal control signal $D_{ADC}$<b:0> to left, so as to increase the first control signal D<n:0>.

Figure 5:
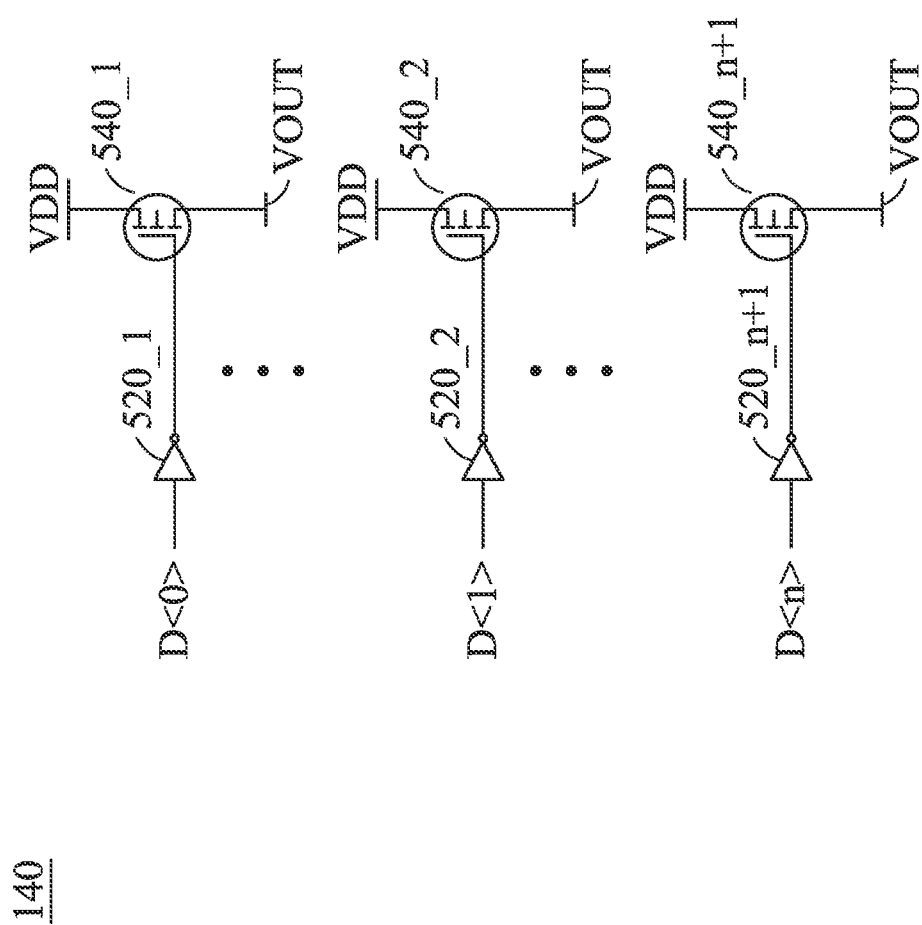
FIG. 5 is a schematic view of a voltage adjusting circuit 140 according to an embodiment of the present invention.

FIG. 5 is a schematic view of a voltage adjusting circuit 140 according to an embodiment of the present invention. As shown in FIG. 5, corresponding to the bit signals D<0>~D<n> of the first control signal D<n:0>, the voltage adjusting circuit 140 includes inverters 520_1~520_n+1 and the transistor groups 540_1~540_n+1. As shown in FIG. 5, an input terminal of the inverter 520_1 receives a bit signal D<0>. An output terminal of the inverter 520_1 outputs an inverted bit signal DB<0>. The transistor group 540_1 includes $2^0$ transistor. A gate of the $2^0$ transistor receives the inverted bit signal DB<0>. The source of the $2^0$ transistor receives a power supply voltage VDD. The drain of the $2^0$ transistor is coupled to the output voltage VOUT. The state (conducting or nonconducting) of the $2^0$ transistor is controlled by the inverted bit signal DB<0> to affect the output voltage VOUT. An input terminal of the inverter 520_2 receives a bit signal D<1>. An output terminal of the inverter 520_2 outputs an inverted bit signal DB<1>. The transistor group 540_2 includes $2^1$ transistors. Gates of the $2^1$ transistors receive the inverted bit signal DB<1>. Sources of the $2^1$ transistors receive the power supply voltage VDD. Drains of the $2^1$ transistors are coupled to the output voltage VOUT. The state (conducting or nonconducting) of the $2^1$ transistors is controlled by the inverted bit signal DB<1> to affect the output voltage VOUT. . . . An input terminal of the inverter 520_n+1 receives a bit signal D<n>. An output terminal of the inverter 520_n+1 outputs an inverted bit signal DB<n>. The transistor group 540_n+1 includes $2^n$ transistors. Gates of the $2^n$ transistors receive an inverted bit signal DB<n>. Sources of the $2^n$ transistor receive the power supply voltage VDD. Drains of the $2^n$ transistors are coupled to the output voltage VOUT. The state (conducting or nonconducting) of the $2^n$ transistors is controlled by the inverted bit signal DB<n> to affect the output voltage VOUT.

Therefore, by controlling the magnitude of the first control signal D<n:0>, the number of conducting transistors of the voltage adjusting circuit 140 may be controlled, so as to stabilize the output voltage VOUT. Specifically, when the first control signal D<n:0> increases, i.e., more high bits of the first control signal D<n:0> become "1", exponential more transistors are turned on, so that the output voltage VOUT can be quickly pulled back. When the first control signal D<n:0> decreases, i.e., more low bits of the first control signal D<n:0> become "1", the number of conducting transistors is gently adjusted, so that the output voltage VOUT does not change significantly. According to an embodiment of the present invention, the $2^0$~$2^n$ transistors included in each of the transistor groups 540_1~540_n+1 are P-type transistors.

Due to the affection of the clock signal CLK, the embodiments shown in FIG. 1 to FIG. 5 are suitable to suppress the undershoot or the overshoot of the output voltage VOUT with a longer duration (for example, the duration of the undershoot or the overshoot is greater than one clock period of the clock signal CLK). The number of conducting transistors of the voltage adjusting circuit 140 is adjusted through the first control signal D<n:0> generated by the first control circuit 120, so as to stabilize the output voltage VOUT. In the embodiment, the undershoot or the overshoot of the output voltage VOUT is caused by the load unit 160.

Figure 6:
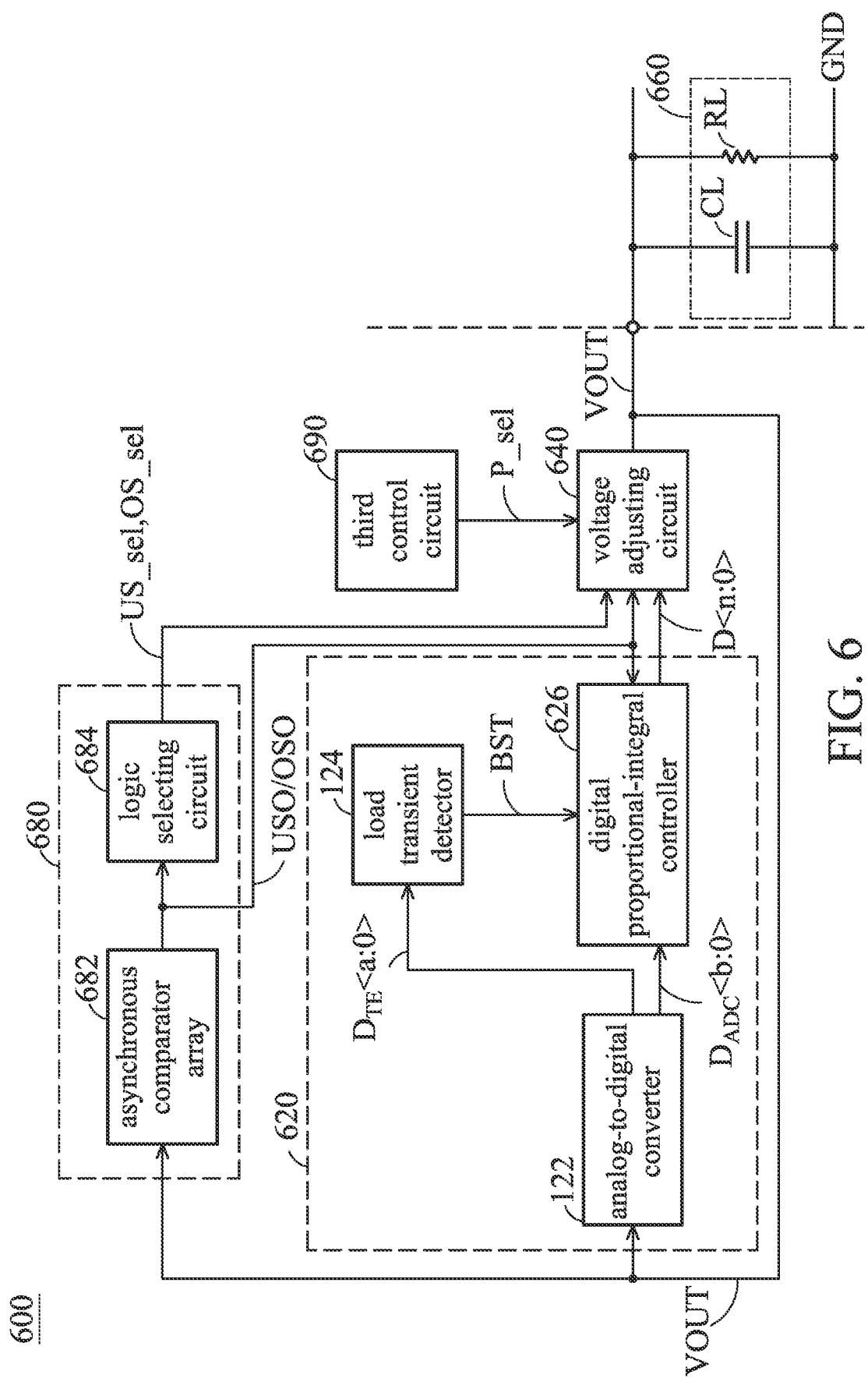
FIG. 6 is a schematic view of a voltage regulator 600 according to another embodiment of the present invention.

FIG. 6 is a schematic view of a voltage regulator 600 according to another embodiment of the present invention. Please refer to FIG. 6. The voltage regulator 600 coupled to a load unit 660 includes a first control circuit 620, a voltage adjusting circuit 640, a second control circuit 680 and a third control circuit 690.

As shown in FIG. 6, the second control circuit 680 is coupled to an output terminal of the voltage adjusting circuit 640 to receive the output voltage VOUT. The second control circuit 680 generates a first selecting US_sel, a second selecting signal OS_sel and protection signals USO/OSO according to the output voltage VOUT. The second control circuit 680 outputs the first selecting signal US_sel and the second selecting signal OS_sel to the voltage adjusting circuit 640. The second control circuit 680 outputs the protection signals USO/OSO to the first control circuit 620 and the voltage adjusting circuit 640. The first control circuit 620 is coupled to the voltage adjusting circuit 640 and the second control circuit 680, and respectively receives the output voltage VOUT and the protection signals USO/OSO. The first control circuit 620 generates a first control signal D<n:0> according to the output voltage VOUT and the protection signals USO/OSO and outputs the first control signal D<n:0> to the voltage adjusting circuit 640. The third control circuit 690 generates a third control signal P_sel and outputs the third control signal P_sel to the voltage adjusting circuit 640. The voltage adjusting circuit 640 is coupled to the first control circuit 620, the second control circuit 680 and the third control circuit 690, and respectively receives the first control signal D<n:0>, the first selecting signal US_sel, the second selecting signal OS_sel, the protection signals USO/OSO and the third control signal P_sel. The voltage adjusting circuit 640 adjusts a number of conducting transistors according to the first control signal D<n:0>, the first selecting signal US_sel, the second selecting signal OS_sel, the protection signals USO/OSO and the third control signal P_sel, so as to stabilize the output voltage VOUT.

As shown in FIG. 6, the first control circuit 620 includes the analog-to-digital converter 122, the load transient detector 124 and a digital proportional-integral controller 626. In the embodiment, the analog-to-digital converter 122 in FIG. 6 is the same as the analog-to-digital converter 122 above, the load transient detector 124 in FIG. 6 is the same as the load transient detector 124 above, and the description thereof is not repeated herein. The digital proportional-integral controller 626 is described below in conjunction with FIG. 7.

The second control circuit 680 may further suppress the undershoot or the overshoot of the output voltage VOUT with a shorter duration (for example, the duration of the undershoot or the overshoot is less than one clock period of the cock signal CLK). The second control circuit 680 includes an asynchronous comparator array 682 and a logic selecting circuit 684. The asynchronous comparator array 682 is coupled to the output terminal of the voltage adjusting circuit 640 to receive the output voltage VOUT, and the asynchronous comparator array 682 generates the protection signals USO/OSO. Herein, the protection signals USO/OSO includes e pairs of sub protection signals USO<1>-OSO<1>~USO<e>-OSO<e>, e is a positive integer.

The output voltage VOUT and a first comparison voltage VREF2_1_$f$ are compared by a comparator for generating a sub protection signal USO<f>, herein the first comparison voltage VREF2_1_$f$ is equal to the idea value of the output voltage VOUT minus f times of a step voltage, represents one of the first comparison voltages VREF2_1_1~VREF2_1_$e$, and the sub protection signal USO<f> represents one of the sub protection signals USO<1>~USO<e>. For example, when the idea value of the output voltage VOUT is 800 mV and the step voltage is 15 mV, the output voltage VOUT and the first comparison voltage VREF2_1_1 of 785 mV are compared by a comparator for generating a sub protection signal USO<1>, the output voltage VOUT and the first comparison voltage VREF2_1_2 of 770 mV are compared by another comparator for generating a sub protection signal USO<2>, . . . , the output voltage VOUT and the first comparison voltage VREF2_1_$e$ of (800−15 e)mV are compared by another comparator for generating a sub protection signal USO<e>.

The output voltage VOUT and a second comparison voltage VREF2_2_$f$ are compared by a comparator for generating the sub protection signal OSO<f> paired with the sub protection signal USO<f, herein the second comparison voltage VREF2_2_$f$ corresponding to the first comparison voltage VREF2_1_$f$ is equal to the idea value of the output voltage VOUT plus f times of the step voltage, represents one of the second comparison voltages VREF2_2_1~VREF2_2_$e$, and the sub protection signal OSO<f> represents one of the sub protection signals OSO<1>~OSO<e>. For example, when the idea value of the output voltage VOUT is 800 mV and the step voltage is 15 mV, the output voltage VOUT and the second comparison voltage VREF2_2_1 of 815 mV are compared by a comparator for generating a sub protection signal OSO<1>, the output voltage VOUT and the second comparison voltage VREF2_2_2 of 830 mV are compared by another comparator for generating a sub protection signal OSO<2>, . . . , the output voltage VOUT and the second comparison voltage VREF2_2_$e$ of (800+15 e)mV are compared by another comparator for generating a sub protection signal OSO<e>.

The selecting logic circuit 684 is coupled to the asynchronous comparator array 682 and the voltage adjusting circuit 640. The selecting logic circuit 684 receives two pairs of sub protection signals of the protection signals USO/OSO to generate a first selecting signal US_sel and a second selecting signal OS_sel, herein the two pairs of sub protection signals include one pair of the pairs USO<2>-OSO<2>~USO<e>-OSO<e> and a first pair of sub protection signals USO<1>-OSO<1>.

According to another embodiment of the present invention, the first control circuit 620 shown in FIG. 6 further includes a first sign converter (not shown) and a second sign converter (not shown). The connection between the analog-to-digital converter 122 and the digital proportional-integral controller 626 is broken. The first sign converter is coupled to the output terminal of the analog-to-digital converter 122 to receive the second internal control signal $D_{ADC}$<b:0>. The first sign converter adds a sign bit to the second internal control signal $D_{ADC}$<b:0>, and then outputs the second internal control signal $D_{ADC}$<b:0> with the added sign bit to the digital proportional-integral controller 626 to determine the output voltage VOUT will be pulled up or down. The connection between the digital proportional-integral controller 626 and the voltage adjusting circuit 640 is broken. The second sign converter is coupled to the output terminal of the digital proportional-integral controller 626 to receive the first control signal $D_{ADC}<n:0>$ with the sign bit. The second sign converter deletes the appendant sign bit of the first control signal $D_{ADC}<n:0>$, and then outputs the first control signal $D_{ADC}<n:0>$ without the appendant sign bit to the voltage adjusting circuit 640 to support the operation of the voltage adjusting circuit 640.

In addition, the third control circuit 690 will be described later in combination with FIG. 10, and the voltage adjusting circuit 640 will be described later in combination with FIG. 11.

Figure 7:
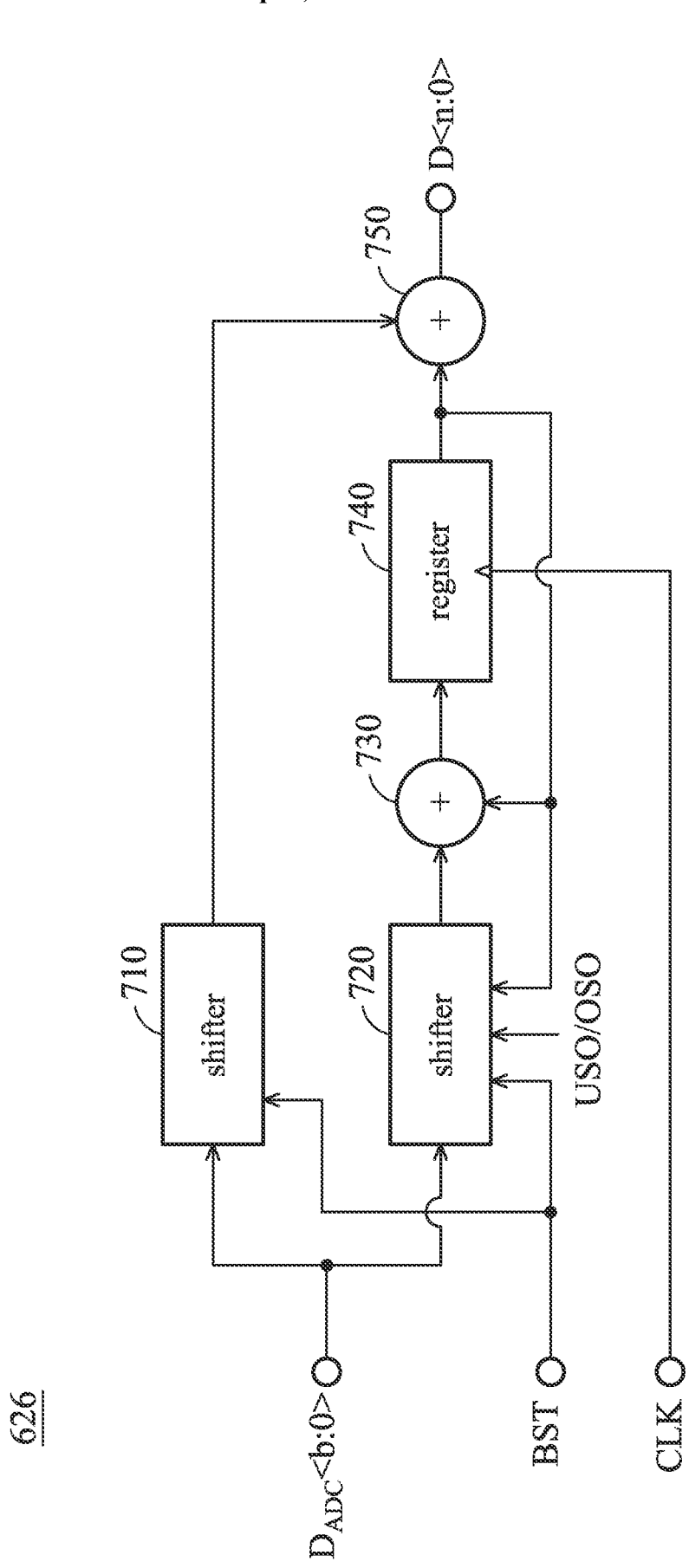
FIG. 7 is a schematic view of a digital proportional-integral controller 626 according to an embodiment of the present invention.

FIG. 7 is a schematic view of a digital proportional-integral controller 626 according to an embodiment of the present invention. As shown in FIG. 7, the digital proportional-integral controller 626 includes a shifter 710, a shifter 720, an adder 730, a register 740 and an adder 750.

The shifter 710 receives the binary second internal control signal $D_{ADC}<b:0>$ and the detecting signal BST to generate a first shifting signal, herein the first shifting signal can be represented as $K_P*D_{ADC}<b:0>$. The shifter 710 controls the magnitude of the proportional term $K_P$ of the shifter 710 according the detecting signal BST, causes the second internal control signal $D_{ADC}<b:0>$ to be shifted to left or right, herein the proportional term $K_P$ controls the number of shifted bits of the second internal control signal $D_{ADC}<b:0>$. The shifter 720 receives the second internal control signal $D_{ADC}<b:0>$, the detecting signal BST, the protection signals USO/OSO and a third adding signal output by the register 740 to generate a second shifting signal. The protection signals USO/OSO instructs the shifter 720 to perform the operation of switching the integral term $K_I$ and input signals. When a sub protection signal $USO<f>$ or $OSO<f>$ of the protection signals USO/OSO is at "1", this indicates that the output voltage VOUT exists the undershoot or overshoot. The shifter 720 generates the second shifting signal according to the sub protection signal $USO<f>$ at "1", herein the second shifting signal is equivalent to 1/k of the third adding signal. Or the shifter 720 generates the second adding signal according to the sub protection signal $OSO<f>$ at "1", herein the second shifting signal is equivalent to −1/k of the third adding signal. Herein k is a i power of 2, and i is a positive integer. If there is no sub protection signal of the protection signals USO/OSO is at "1", this indicates that the output voltage VOUT does not exist the undershoot/overshoot. The magnitude of the integral term $K_I$ of the shifter 720 is still controlled by the detecting signal BST to generate the second shifting signal, herein the second shifting signal can be represented $K_I*D_{ADC}<b:0>$.

The adder 730 is coupled to the shifter 720. A first input terminal of the adder 730 receives the second shifting signal. A second input terminal of the adder 730 receives the third adding signal. In a third clock period of the clock signal CLK, the adder 730 adds the second shifting signal and the third adding signal to generate a fourth adding signal. The register 740 is coupled to the adder 730. A data input terminal of the register 740 receives the fourth adding signal. Under driving of the clock signal CLK in a fourth clock period, the register 740 outputs the fourth adding signal and feeds the fourth adding signal back to the second input terminal of the adder 730 and the input terminal of the shifter 720, to server as the third adding signal supplied to perform the addition calculation and the switching operation, herein the addition calculation is operated by the adder 730 and the switching operation is operated by the shifter 720. Before the register 740 outputs the fourth adding signal under driving the clock signal CLK in the fourth clock period, the adder 750 coupled to the shifter 710 and the register 740 adds the first shifting signal in the third clock period and the third adding signal in the third clock period to generate the first control signal D[d−1] in the third clock period. In the embodiment, the fourth clock period is a certain clock period of the clock signal CLK, and the third clock period is the previous adjacent clock period of the fourth clock period of the clock signal CLK.

When there is no sub protection signal of the protection signals USO/OSO is at "1", the first control signal D[d] in the fourth clock period of the clock signal CLK may be expressed as:

$$D[d]=D[d-1]+K_P\{D_{ADC}[d]-D_{ADC}[d-1]\}+K_I D_{ADC}[d-1]$$

Wherein D[d] is the first control signal $D<n:0>$ in the fourth clock period of the clock signal CLK, D[d−1] is the first control signal $D<n:0>$ in the third clock period of the clock signal CLK, $K_P$ is the proportional term of the shifter 710, $K_I$ is the integral term of the shifter 720, $D_{ADC}$[d] is the second internal control signal $D_{ADC}<b:0>$ in the fourth clock period of the clock signal CLK, and $D_{ADC}$ [d−1] is the second internal clock signal $D_{ADC}<b:0>$ in the third clock period of the clock signal CLK.

When a sub protection signal $USO<f>$ of $OSO<f>$ of the protection signals USO/OSO is at "1", the first control signal D[d] in the fourth clock period of the clock signal CLK may be expressed as:
when $USO<f>=1$, $$D[d] = \frac{k+1}{k}D[d-1] + K_P\left\{D_{ADC}[d] - \frac{k+1}{k}D_{ADC}[d-1]\right\}\frac{k+1}{k}\frac{k+1}{k};$$

when $OSO<f>=1$, $$D[d] = \frac{k-1}{k}D[d-1] + K_P\left\{D_{ADC}[d] - \frac{k-1}{k}D_{ADC}[d-1]\right\}\frac{k-1}{k}\frac{k-1}{k}.$$

Wherein, D[d] is the first control signal $D<n:0>$ in the fourth clock period of the clock signal CLK, D[d−1] is the first control signal $D<n:0>$ in the third clock period of the clock signal CLK, $K_P$ is the proportional term of the shifter 710, $K_I$ is the integral term of the shifter 720, $D_{ADC}$ [d] is the second internal control signal $D_{ADC}<b:0>$ in the fourth clock period of the clock signal CLK, and $D_{ADC}$ [d−1] is the second internal clock signal $D_{ADC}<b:0>$ in the third clock period of the clock signal CLK.

Specifically, when a sub protection signal $USO<f>$ or $OSO<f>$ of the protection signals USO/OSO is at "1", the shifter 720 directly uses ±1/k of the third adding signals as the second shifting signal, so as to quickly increase/decrease the first control signal $D<n:0>$, herein k is the i power of 2, and i is a positive integer. Therefore, another embodiment of the present invention takes the protection signals USO/OSO as selection control signals to control a selecting circuit, when a sub protection signal $USO<f>$ or $OSO<f>$ of the protection signals USO/OSO is at "1", the third adding signal without the last i bits (±1/k of the third adding signal) is taken as the second shifting signal, herein the second shifting signal can be directly output from the output terminal of the register 740 to the first input terminal of the adder 730. When there is no sub protection signal of the protection signals USO/OSO is at "1", the shifter 720 outputs the second shifting signal equal to $K_I*D_{ADC}<b:0>$ to the first input terminal of the adder 730, the digital proportional-integral controller 626 performs the same operation as the digital proportional-integral controller 126 above.

Figure 8:
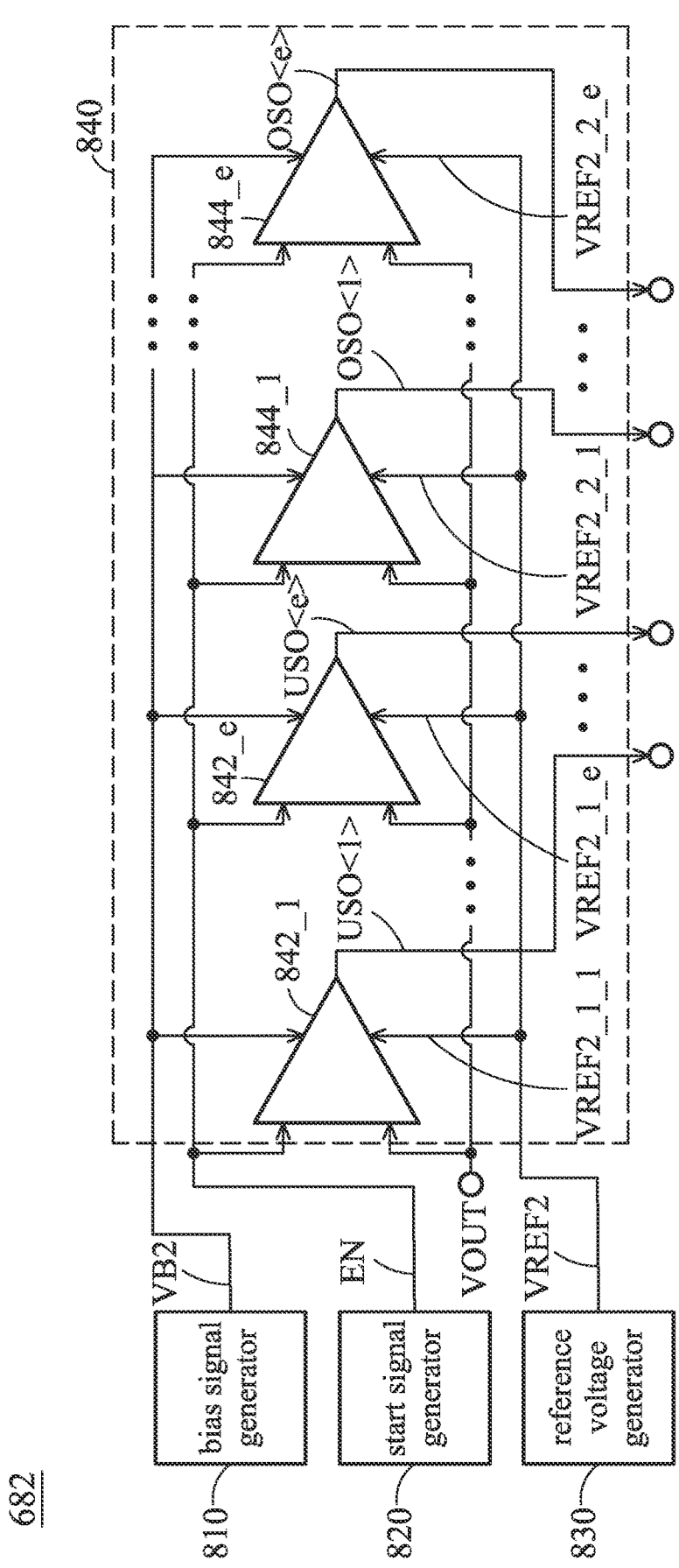
FIG. 8 is a schematic view of an asynchronous comparator array 682 according to an embodiment of the present invention.

FIG. 8 is a schematic view of an asynchronous comparator array 682 according to an embodiment of the present invention. As shown in FIG. 8, the asynchronous comparator array 682 includes a bias signal generator 810, a start signal generator 820, a reference voltage generator 830 and a comparator group 840. The bias signal generator 810 generates a bias signal VB2. The start signal generator 820 generates a start signal EN. The reference voltage generator 830 generates a reference voltage VREF2, wherein the reference voltage VREF2 includes e first comparison voltages VREF2_1_1~VREF2_1_e above and e second comparison voltages VREF2_2_1~VREF2_2_e above, so as to generate the protection signals USO/OSO including e pairs of protection signals above.

The comparator group 840 includes comparators 842_1~842_e and comparators 844_1~844_e. Each of the comparators 842_1~842_e includes a first input terminal, a second input terminal, a third input terminal, a fourth input terminal and an output terminal. The first input terminal of each of the comparators 842_1~842_e receives the output voltage VOUT. The second input terminal of each of the comparators 842_1~842_e is coupled to the start signal generator 820 to receive the start signal EN. The third input terminal of each of the comparator 842_1~842_e is coupled to the bias signal generator 810 to receive the bias signal VB2. The fourth input terminal of each of the comparators 842_1~842_e is coupled to the reference voltage generator 830 to receive one of the first comparison voltages VREF2_1_1~VREF2_1_e.

The fourth input terminal of the comparator 842_1 is coupled to the reference voltage generator 830 to receive the first comparison voltage VREF2_1_1, and the comparator 842_1 compares the output voltage VOUT with the first comparison voltage VREF2_1_1 to generate the sub protection signal USO<1>. The fourth input terminal of the comparator 842_2 is coupled to the reference voltage generator 830 to receive the first comparison voltage VREF2_1_2, and the comparator 842_2 compares the output voltage VOUT with the first comparison voltage VREF2_1_2 to generate the sub protection signal USO<2> . . . . The fourth input terminal of the comparator 842_e is coupled to the reference voltage generator 830 to receive the first comparison voltage VREF2_1_e, and the comparator 842_e compares the output voltage VOUT with the first comparison voltage VREF2_1_e to generate the sub protection signal USO<e>.

Each of the comparators 844_1~844_e includes a first input terminal, a second input terminal, a third input terminal, a fourth input terminal and an output terminal. The first input terminal of each of the comparators 844_1~844_e receives the output voltage VOUT. The second input terminal of each of the comparators 844_1~844_e is coupled to the start signal generator 820 to receive the start signal EN. The third input terminal of each of the comparators 844_1~844_e is coupled to the bias signal generator 810 to receive the bias signal VB2. The fourth input terminal of each of the comparators 844_1~844_e is coupled to the reference voltage generator 830 to receive one of the second comparison voltages VREF2_2_1~VREF2_2_e.

The fourth input terminal of the comparator 844_1 is coupled to the reference voltage generator 830 to receive the second comparison voltage VREF2_2_1, and the comparator 844_1 compares the output voltage VOUT with the second comparison voltage VREF2_2_1 to generate the sub protection signal OSO<1>. The fourth input terminal of the comparator 844_2 is coupled to the reference voltage generator 830 to receive the second comparison voltage VREF2_2_2, and the comparator 844_2 compares the output voltage VOUT with the second comparison voltage VREF2_2_2 to generate the sub protection signal OSO<2> . . . . The fourth input terminal of the comparator 844_e is coupled to the reference voltage generator 830 to receive the second comparison voltage VREF2_2_e, and the comparator 844_e compares the output voltage VOUT with the second comparison voltage VREF2_2_e to generate the sub protection signal OSO<e>.

Figure 9:
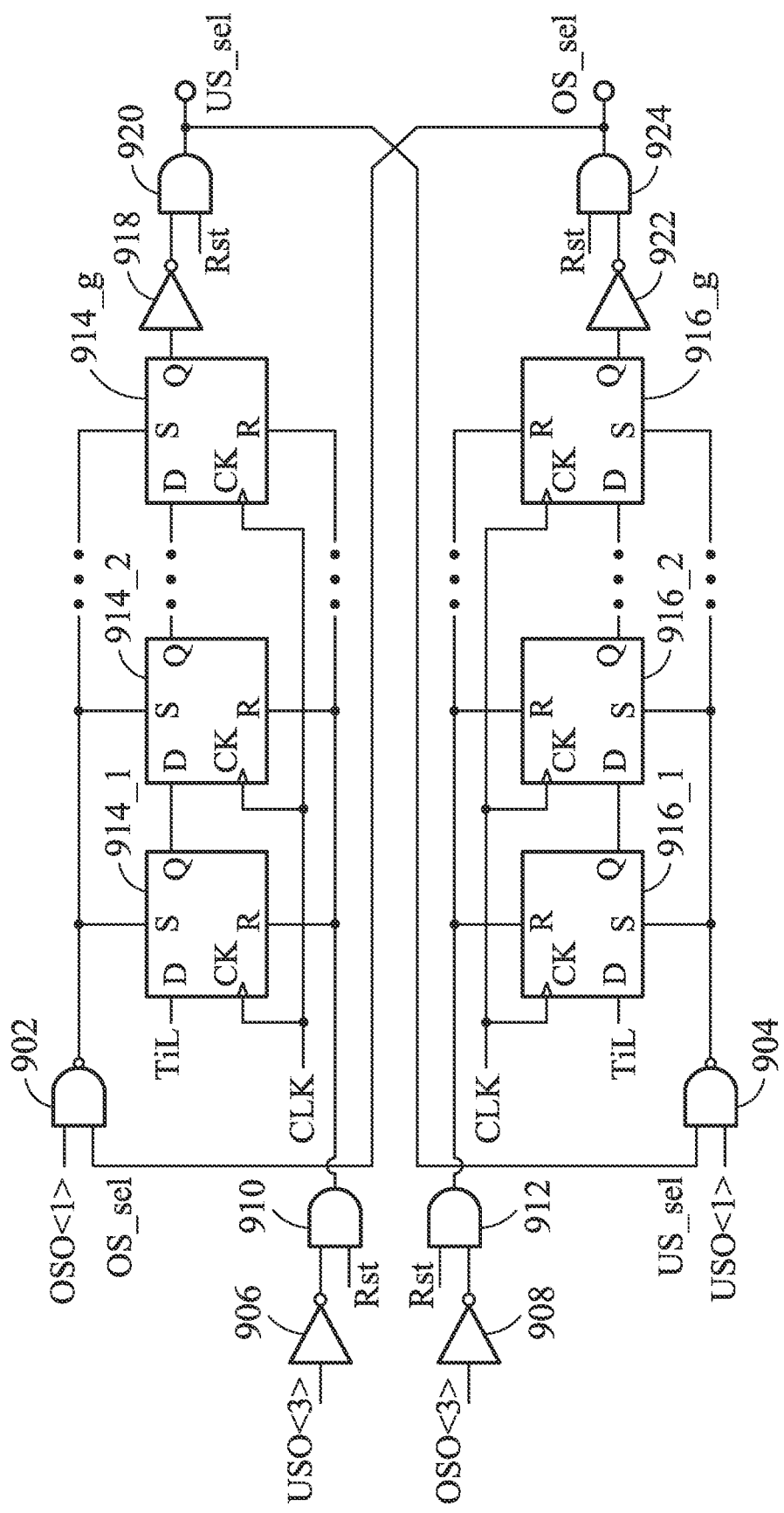
FIG. 9 is a schematic view of a logic selecting circuit 684 according to an embodiment of the present invention.

FIG. 9 is a schematic view of a logic selecting circuit 684 according to an embodiment of the present invention. As shown in FIG. 9, the logic selecting circuit 684 includes a NAND gate 902, a NAND gate 904, an inverter 906, an inverter 908, a AND gate 910, a AND gate 912, D flip-flops 914_1~914_g, D flip-flops 916_1~916_g, an inverter 918, a AND gate 920, an inverter 922 and a AND gate 924.

As mentioned above, the selecting logic circuit 684 receives the two pairs of sub protection signals of the protection signals USO/OSO to generate the first selecting signal US_sel and the second selecting signal OS_sel, wherein the two pairs of sub protection signals include one pair of the pairs USO<2>-OSO<2>~USO<e>-OSO<e> and the first pair of sub protection signals USO<1>-OSO<1>. As shown in FIG. 9, the NAND gate 902 includes a first input terminal, a second input terminal and an output terminal. The first input terminal of the NAND gate 902 receives the sub protection signal OSO<1>. The second input terminal of the NAND gate 902 receives the second selecting signal OS_sel. The NAND gate 904 includes a first input terminal, a second input terminal and an output terminal. The first input terminal of the NAND gate 904 receives the sub protection signal USO<1>. The second input terminal of the NAND gate 904 receives the first selecting signal US_sel.

The inverter 906 includes an input terminal and an output terminal. The input terminal of the inverter 906 receives, for example, the sub protection signal USO<3>. The inverter 908 includes an input terminal and an output terminal. The input terminal of the inverter 908 receives the sub protection signal OSO<3>.

The AND gate 910 includes a first input terminal, a second input terminal and an output terminal. The first input terminal of the AND gate 910 is coupled to the output terminal of the inverter 906. The second input terminal of the AND gate 910 receives a reset signal Rst. The AND gate 912 includes a first input terminal, a second input terminal and an output terminal. The first input terminal of the AND gate 912 is coupled to the output terminal of the inverter 908. The second input terminal of the AND gate 912 receives the reset signal Rst.

Each of the D flip-flops 914_1~914_g includes a first input terminal (D terminal), a second input terminal (CK terminal), a third input terminal (S terminal), a fourth input terminal (R terminal) and an output terminal (Q terminal). Herein, the first input terminal of the first D flip-flop 914_1 receives the data signal TiL, the data signal TiL is, for example, constantly at a low level. The first input terminal of the (j+1)-th D flip-flop 914_j+1 is coupled to the output terminal of the j-th D flip-flop 914_j, wherein the positive integer j is smaller than g. For example, the first input terminal of the second D flip-flop 914_2 is coupled to the output terminal of the first D flip-flop 914_1, the first input terminal of the third D flip-flop 914_3 is coupled to the output terminal of the second D flip-flop 914_2, . . . , the first input terminal of the g-th D flip-flop 914_g is coupled to the output terminal of the (g−1)-th D flip-flop 914_g−1. The second input terminals of the D flip-flops 914_1~914_g receive the clock signal CLK. The third input terminals of the D flip-flops 914_1~914_g are coupled to the output terminal of the NAND gate 902 to receive the output signal of the NAND gate 902. The fourth input terminals of the D flip-flops 914_1~914_g are coupled to the output terminal of the AND gate 910 to receive the output signal of the AND gate 910.

Each of the D flip-flops 916_1~916_g includes a first input terminal (D terminal), a second input terminal (CK terminal), a third input terminal (S terminal), a fourth input terminal (R terminal) and an output terminal (Q terminal). The first input terminal of the first D flip-flop 916_1 receives the data signal TiL. The first input terminal of the (j+1)-th D flip-flop 916_j+1 is coupled to the output terminal of the j-th D flip-flop 916_j. For example, the first input terminal of the second D flip-flop 916_2 is coupled to the output terminal of the first D flip-flop 916_1, the first input terminal of the third D flip-flop 916_3 is coupled to the output terminal of the second D flip-flop 916_2, . . . , the first input terminal of the g-th D flip-flop 916_g is coupled to the output terminal of the (g−1)-th D flip-flop 916_g−1. The second input terminals of the D flip-flops 916_1~916_g receive the clock signal CLK. The third input terminals of the D flip-flops 916_1~916_g are coupled to the output terminal of the NAND gate 904 to receive the output signal of the NAND gate 904. The fourth input terminals of the D flip-flops 916_1~916_g are coupled to the output terminal of the AND gate 912 to receive the output signal of the AND gate 912, wherein g is a positive integer greater than 1.

The inverter 918 includes an input terminal and an output terminal. The input terminal of the inverter 918 is coupled to the output terminal of the D flip-flop 914_g. The AND gate 920 includes a first input terminal, a second input terminal and an output terminal. The first input terminal of the AND gate 920 is coupled to the output terminal of the inverter 918 to receive the output signal of the inverter 918. The second input terminal of the AND gate 920 receives the reset signal Rst. The output terminal of the AND gate 920 outputs the first selecting signal US_sel.

The inverter 922 includes an input terminal and an output terminal. The input terminal of the inverter 922 is coupled to the output terminal of the D flip-flop 916_g. The AND gate 924 includes a first input terminal, a second input terminal and an output terminal. The first input terminal of the AND gate 924 is coupled to the output terminal of the inverter 922 to receive the output signal of the inverter 922. The second input terminal of the AND gate 924 receives the reset signal Rst. The output terminal of the AND gate 924 outputs the second selecting signal OS_sel.

The first selecting signal US_sel is generated through the NAND gate 902, the D flip-flops 914_1~914_g, the inverter 918 and the AND gate 920, and the second selecting signal OS_sel is generated through the NAND 904, the D flip-flops 916_1~916_g, the inverter 922 and the AND gate 924, so as to detect whether the output voltage VOUT fluctuates between a certain pair of comparison voltages above, such as the second comparison voltage VREF2_2_f and the first comparison voltage VREF2_1_f.

Figure 10:
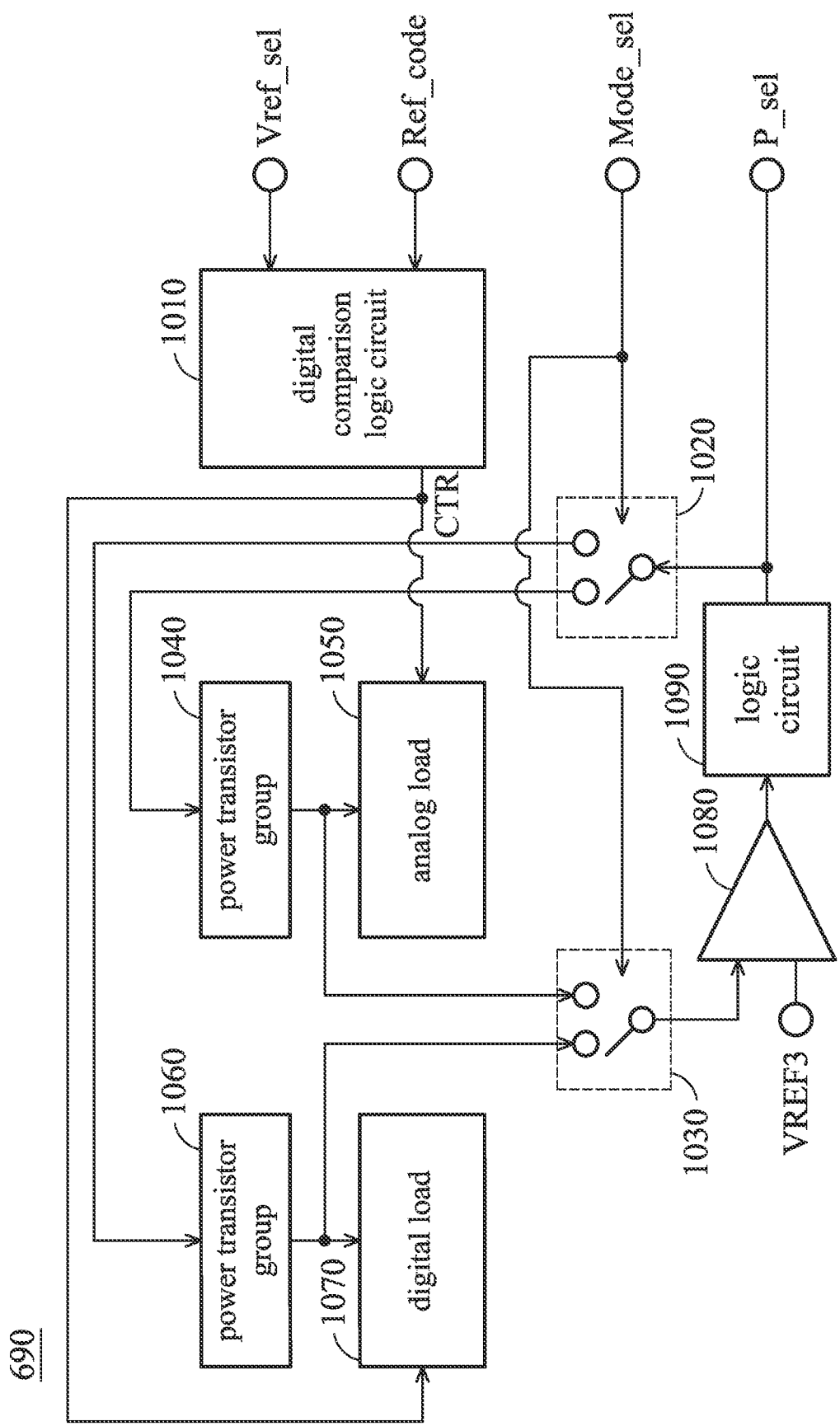
FIG. 10 is a schematic view of a third control circuit 690 according to an embodiment of the present invention.

FIG. 10 is a schematic view of a third control circuit 690 according to an embodiment of the present invention. As shown in FIG. 10, the third control circuit 690 includes a digital comparison logic circuit 1010, a selecting circuit 1020, a selecting circuit 1030, a power transistor group 1040, an analog load 1050, a power transistor group 1060, a digital load 1070, a comparator 1080 and a logic circuit 1090.

The digital comparison logic circuit 1010 receives the reference voltage selecting signal Vref_sel and a reference code signal Ref code, and generates a control signal CTR according to the reference voltage selecting signal Vref_sel and the reference code signal Ref code. The selecting circuit 1020 includes an input terminal, a first output terminal, a second output terminal and a control terminal. The control terminal of the selecting circuit 1020 receives a mode switching signal Mode_sel. The selecting circuit 1030 includes a first input terminal, a second input terminal, an output terminal and a control terminal. The control terminal of the selecting circuit 1030 receives the mode switching signal Mode_sel.

The power transistor group 1040 is coupled to the first output terminal of the selecting circuit 1020 to receive a first output signal output by the selecting circuit 1020. The power transistor group 1040 generates a first input signal according to the first output signal. The power transistor group 1040 is further coupled to the first input terminal of the selecting circuit 1030, so as to output the first input signal to the first input terminal of the selecting circuit 1030.

The analog load 1050 is coupled to the digital comparison logic circuit 1010 and the power transistor group 1040. The analog load 1050 receives the control signal CTR, and generates different impedance values under the control of the control signal CTR. In the embodiment, the analog load 1050 includes, for example, resistors and capacitors connected in series or in parallel.

The power transistor group 1060 is coupled to the second input terminal of the selecting circuit 1020 to receive a second output signal output by the selecting circuit 1020. The power transistor group 1060 generates a second input signal according to the second output signal. The power transistor group 1060 is further coupled to the second input terminal of the selecting circuit 1030, and outputs the second input signal to the second input terminal of the selecting circuit 1030.

The digital load 1070 is coupled to the digital comparison logic circuit 1010 and the power transistor group 1060. The digital load 1070 receives the control signal CTR, and finely adjusts the logic components in the digital load 1070 under the control of the control signal CTR. In the embodiment, the digital load 1070 includes, for example, logic components connected in series or in parallel.

The comparator 1080 includes a first input terminal, a second input terminal and an output terminal. The first input terminal of the comparator 1080 is coupled to the output terminal of the selecting circuit 1030. The second input terminal of the comparator 1080 receives a reference voltage VREF3. The logic circuit 1090 is coupled to the output terminal of the comparator 1080 and the input terminal of the selecting circuit 1020. The logic circuit 1090 generates the third control signal P_sel according to the output signal of the comparator 1080, and outputs the third control signal P_sel to the input terminal of the selecting circuit 1020.

The response speed of the analog load 1050 is fast, but the accuracy of the analog load 1050 is not enough. The accuracy of the digital load 1070 is enough, but the response speed of the digital load 1070 is slow. Therefore, the digital load 1070 is used to calibrate the analog load 1050.

Specifically, the third control circuit 690 is preset to be worked in a digital load mode, the mode selecting signal Mode_sel is set to the first level in advance, so that the selecting circuit 1020 outputs the third control signal P_sel as the second output signal output to the power transistor group 1060, and the power transistor group 1060 generates an appropriate voltage or current to drive the digital load 1070, wherein the digital load 1070 is proportionally set as a miniature version of the load unit 660 above. Under the control of the mode selecting signal Mode_sel of the first level, the selecting circuit 1030 outputs the second input signal generated by the power transistor group 1060 as the output signal of the selecting circuit 1030 to the first input terminal of the comparator 1080. The comparator 1080 compares the second input signal generated by the power transistor group 1060 with the reference voltage VREF3 to generate the output signal and output the output signal to the logic circuit 1090. The logic circuit 1090 performs the logic operation on the output signal of the comparator 1080 to generate the third control signal P_sel. The selecting circuit 1020, the power transistor group 1060, the selecting circuit 1030, the comparator 1080 and the logic circuit 1090 form a negative feedback loop. The negative feedback loop is balanced by driving the digital load 1070, so as to generate stable third control signal P_sel. Then, the mode selecting signal Mode_sel is switched to the second level, the third control circuit 690 is switched to an analog load mode, the reference voltage selecting signal Vref_sel and the reference code signal Ref code are adjusted, the third control signal P_sel is adjusted to be consistent with the stable third control signal P_sel generated in the digital load mode, so as to complete the calibration work, thereby completing the initialization of the third control signal P_sel in the analog load mode.

After the initialization of the third control signal P_sel is completed, the selecting circuit 1020 outputs the third control signal P_sel as the first output signal of the selecting circuit 1020 to the power transistor group 1040, and the power transistor group 1040 generates a voltage/current to drive the analog load 1050, wherein the analog load 1050 is proportionally set as a miniature version of the load unit 660 above. Under the control of the mode selecting signal Mode_sel of the second level, the selecting circuit 1030 outputs the first input signal generated by the power transistor group 1040 as the output signal of the selecting circuit 1030 to the first input terminal of the comparator 1080. The comparator 1080 compares the first input signal generated by the power transistor group 1040 with the reference voltage VREF3, so as to adjust the third control signal P_sel under a working state. In the embodiment, the selecting circuit 1020, the power transistor group 1040, the selecting circuit 1030, the comparator 1080 and the logic circuit 1090 form a negative feedback loop. The negative feedback loop adjusts the third control signal P_sel by driving the analog load 1050, so as to adjust the number of conducting transistors in the voltage adjusting circuit 640.

Figure 11:
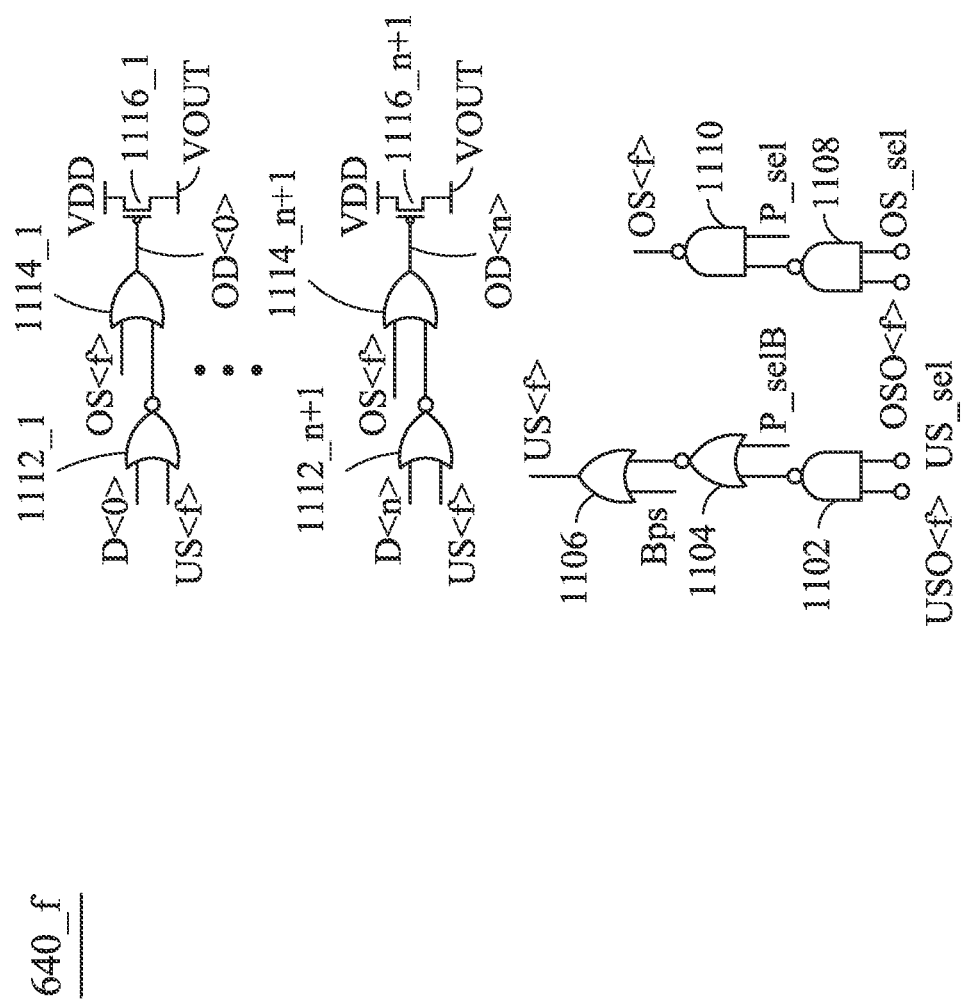
FIG. 11 is a schematic view of a voltage adjusting sub-circuit 640_f according to an embodiment of the present invention.

FIG. 11 is a schematic view of a voltage adjusting sub-circuit 640_f according to an embodiment of the present invention. Corresponding to the logarithm e of the protection signals USO/OSO above, the voltage adjusting circuit 640 includes e voltage adjusting sub-circuits 640_1~640_e. If e is equal to 4, the voltage adjusting circuit 640 includes 4 voltage adjusting sub-circuits 640_1~640_4. Each of the voltage adjusting sub-circuits 640_1~640_e receives a pair of sub protection signals. For example, the voltage adjusting sub-circuit 640_1 receives a first pair of sub protection signals USO<1>-OSO<1>, the voltage adjusting sub-circuit 640_2 receives a second pair of sub protection signals USO<2>-OSO<2>, the voltage adjusting sub-circuit 640_3 receives a third pair of sub protection signals USO<3>-OSO<3>, . . . , the voltage adjusting sub-circuit 640_e receives a e-th pair of sub protection signals USO<e>-OSO<e>. Besides this, voltage adjusting sub-circuits 640_1~640_e receive the same signals and have the same structure. Therefore, the voltage adjusting sub-circuit 640_f is taken as an example for detailed description. The voltage adjusting sub-circuit 640_f represents one of the voltage adjusting sub-circuits 640_1~640_e. For example, when f is 1, FIG. 11 shows the voltage adjusting sub-circuit 640_1, and the voltage adjusting sub-circuit 640_1 receives the first pair of sub protection signals USO<1>-OSO<1>. When f is 2, FIG. 11 shows the voltage adjusting sub-circuit 640_2, and the voltage adjusting sub-circuit 640_2 receives the second first pair of sub protection signals USO<2>-OSO<2> . . . . When f is e, FIG. 11 shows the voltage adjusting sub-circuit 640_e, and the voltage adjusting sub-circuit 640_e receives the e-th pair of sub protection signals USO<e>-OSO<e>.

As shown in FIG. 11, the voltage adjusting sub-circuit 640_f includes a NAND gate 1102, a NOR gate 1104, a OR gate 1106, a NAND gate 1108, a NAND gate 1110, NOR gates 1112_1~1112_n+1, OR gates 1114_1~1114_n+1 and P-type transistor groups 1116_1~1116_n+1.

The NAND gate 1102 includes a first input terminal, a second input terminal and an output terminal. The first input terminal of the NAND gate 1102 receives the sub protection signal USO<f>. The second terminal of the NAND gate 1102 receives the first selecting signal US_sel. The NOR gate 1104 includes a first input terminal, a second input terminal and an output terminal. The first input terminal of the NOR gate 1104 is coupled to the output terminal of the NAND gate 1102 to receive the output signal of the NAND gate 1102. The second input terminal of the NOR gate 1104 receives an inverted signal P_selB of the third control signal P_sel. The OR gate 1106 includes a first input terminal, a second input terminal and an output terminal. The first input terminal of the OR gate 1106 receives a bypass signal Bps. The second input terminal of the OR gate 1106 is coupled to the output terminal of the NOR gate 1104 to receive the output signal of the NOR gate 1104, the OR gate 1106 outputs an output signal US<f> through the output terminal thereof. The NAND gate 1108 includes a first input terminal, a second input terminal and an output terminal. The first input terminal of the NAND gate 1108 receives the sub protection signal OSO<f> paired with the sub protection signal USO<f>. The second input terminal of the NAND gate 1108 receives the second selecting signal OS_sel. The NAND gate 1110 includes a first input terminal, a second input terminal and an output terminal. The first input terminal of the NAND gate 1110 is coupled to the output terminal of the NAND gate 1108 to receive the output signal of the NAND gate 1108. The second input terminal of the NAND gate 1110 receives the third control signal P_sel. The NAND gate 1110 outputs an output signal OS<f> through the output terminal thereof. The NAND gate 1102 performs the NAND operation on the sub protection signal USO<f> and the selecting signal US_sel, and the NAND gate 1108 performs the NAND operation on the sub protection signal OSO<f> and the selecting signal OS_sel, so as to avoid the situation wherein the output voltage VOUT is adjusted to oscillate between a certain pair of comparison voltages, such as the second comparison voltage VREF2_2_f and the first comparison voltage VREF2_1_f above.

Each of the NOR gates 1112_1~1112_n+1 includes a first input terminal, a second input terminal and an output terminal. Each of the NOR gates 1112_1~1112_n+1 receives a corresponding bit of the first control signal D<n:0>. For example, as shown in FIG. 11, the first input terminal of the NOR gate 1112_1 receives D<0> of the first control signal D<n:0>. The first input terminal of the NOR gate 1112_2 receives D<1> of the first control signal D<n:0>. The first input terminal of the NOR gate 1112_3 receives D<2> of the first control signal D<n:0> . . . . The first input terminal of the NOR gate 1112_n+1 receives D<n> of the first control signal D<n:0>. The second input terminal of each of the NOR gates 1112_1~1112_n+1 is coupled to the output terminal of the OR gate 1106_1 to receive the signal US<f.

Each of the OR gates 1114_1~1114_n+1 includes a first input terminal, a second input terminal and an output terminal. The first input terminal of each of the OR gates 1114_1~1114_n+1 is coupled to the output terminal of the NAND gate 1110 to receive the signal OS<f. The second input terminal of each of the OR gates 1114_1~1114_n+1 is coupled to the output terminal of a corresponding NOR gate of the NOR gates 1112_1~1112_n+1. For example, the second input terminal of the OR gate 1114_1 is coupled to the output terminal of the NOR gate 1112_1, the second input terminal of the OR gate 1114_2 is coupled to the output terminal of the NOR gate 1112_2, the second input terminal of the OR gate 1114_3 is coupled to the output terminal of the NOR gate 1112_3, . . . , the second input terminal of the OR gate 1114_n+1 is coupled to the output terminal of the NOR gate 1112_n+1. The OR gates 1114_1~1114_n+1 generate and output bit signals OD<0>~OD<n> respectively. For example, the OR gate 1114_1 outputs a bit signal OD<0> through the output terminal thereof, the OR gate 1114_2 outputs a bit signal OD<1> through the output terminal thereof, the OR gate 1114_3 outputs a bit signal OD<2> through the output terminal thereof, . . . , the OR gate 1114_n+1 outputs a bit signal OD<n> through the output terminal thereof.

The P-type transistor groups 1116_1~1116_n+1 respectively include $2^0$~$2^n$ P-type transistors. For example, the P-type transistor group 1116_1 includes $2^0$ transistor. A gate of the $2^0$ transistor receives the bit signal OD<0>. A source of the $2^0$ transistor receives the power supply voltage VDD. A drain of the $2^0$ transistor is coupled to the output voltage VOUT. The state (conducting or nonconducting) of the $2^0$ transistor is controlled by the bit signal OD<0> to affect the output voltage VOUT. The P-type transistor group 1116_2 includes $2^1$ transistors. The gates of the $2^1$ transistors receive the bit signal OD<1>. The sources of the $2^1$ transistors receive the power supply voltage VDD. The drains of the $2^1$ transistors are coupled to the output voltage VOUT. The state (conducting or nonconducting) of the $2^1$ transistors is controlled by the bit signal OD<1> to affect the output voltage VOUT. . . . The P-type transistor group 1116_n+1 includes $2^n$ transistors. The gates of the $2^n$ transistors receive the bit signal OD<n>. The sources of the $2^n$ transistor receive the power supply voltage VDD. The drains of the $2^n$ transistors are coupled to the output voltage VOUT. The state (conducting or nonconducting) of the $2^n$ transistors is controlled by the bit signal OD<n> to affect the output voltage VOUT.

Thus, the protection signals USO/OSO, the first selecting signal US_sel, the second signal OS_sel, the third signal P_sel, the bypass signal Bps and the first control signal D<9:0> may be used to control the number of conducting transistors of the P-type transistor groups 1116_1~1116_10, so as to adjust the output voltage VOUT, so that the output voltage VOUT affected by the load unit may be quickly pulled back.

In summary, the embodiments shown in FIGS. 6 to 11 may simultaneously suppress the undershoot or the overshoot of the output voltage VOUT with the longer duration (for example, the duration of the undershoot or the overshoot is greater than one clock period of the clock signal CLK) and the shorter duration (for example, the duration of the undershoot or the overshoot is less than one clock period of the clock signal CLK). Since the operation of the first control circuit 620 is affected by the clock signal CLK, the first control circuit 620 directly generates the first control signal D<n:0> to finely adjust the number of conducting transistors in the voltage adjusting circuit 640, so as to suppress the undershoot/overshoot of the output voltage VOUT with the longer duration (for example, the duration of the undershoot or the overshoot is greater than one clock period of the clock signal CLK). Since the operation of the asynchronous comparator array 682 is not affected by the clock signal CLK, the second control circuit 680 generate the protection signals USO/OSO to quickly adjust the magnitude of the first control signal D<n:0>, so as to monitor and suppress the undershoot/overshoot of the output voltage VOUT with the shorter duration (for example, the duration of the undershoot or the overshoot is less than one clock period of the clock signal CLK) in real time. Furthermore, the first selecting signal US_sel and the second selecting signal OS_sel are applied to each voltage adjusting sub-circuit in the voltage adjusting circuit 640, so as to avoid the situation where the output voltage VOUT is adjusted to fluctuate between a certain pair of the comparison voltages. The third control signal P_sel is generated by the third control circuit 690 so that the number of conducting transistors in the voltage adjusting circuit 640 may be roughly adjusted.

Figure 12:
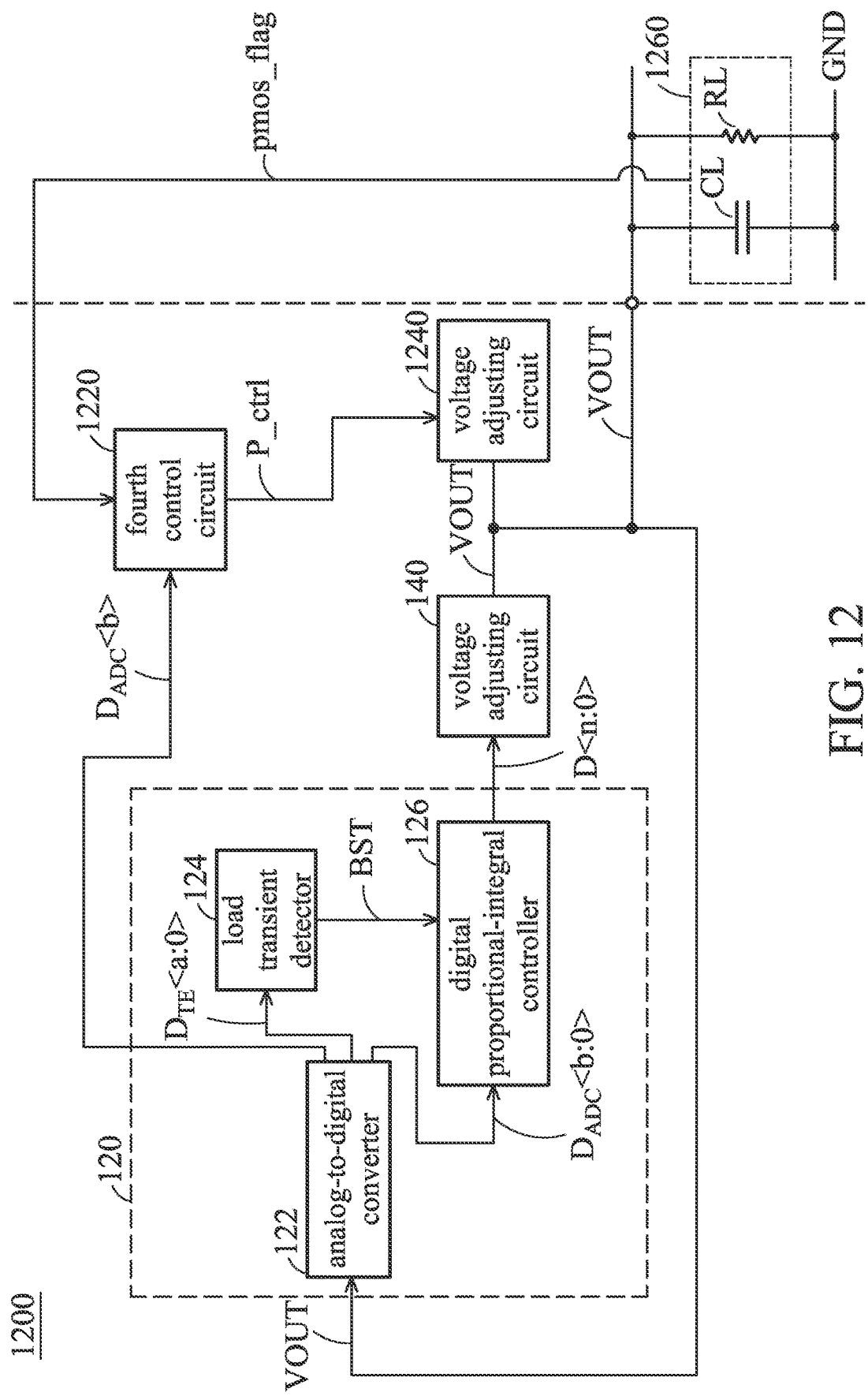
FIG. 12 is a schematic view of a voltage regulator 1200 according to another embodiment of the present invention.

FIG. 12 is a schematic view of a voltage regulator 1200 according to another embodiment of the present invention. Please to refer to FIG. 12. The voltage regulator 1200 coupled to a load unit 1260 includes a first control circuit 120, a voltage adjusting circuit 140, a fourth control circuit 1220 and a voltage adjusting circuit 1240.

In the embodiment, the first control circuit 120 and the first voltage adjusting circuit 140 are the same as or similar to those described above and may bring about the same technical effect. For details, please to refer to the description of the embodiments of FIG. 1 to FIG. 5, and the description thereof is not repeated herein.

The fourth control circuit 1220 is coupled to the analog-to-digital converter 122 to receive the highest bit $D_{ADC}$<b> of the second internal control signal $D_{ADC}$<b:0>, and generate a fourth control signal P_ctrl according to a first flag signal pmos_flag and the highest bit $D_{ADC}$<b> of the second internal control signal $D_{ADC}$<b:0>. In the embodiment, the first flag signal pmos_flag is generated by the load unit 1260 and output to the fourth control circuit 1220. When the load unit 1260 is switched from light load state to heavy load state, the level of the first flag signal pmos_flag will be reversed.

The voltage adjusting circuit 1240 is coupled to the fourth control circuit 1220 to receive the fourth control signal P_ctrl. The voltage adjusting circuit 1240 adjusts a number of conducting transistors in the voltage adjusting circuit 1240 according to the fourth control signal P_ctrl, so as to adjust the output voltage VOUT. Therefore, when the load unit 1260 is switched from a light load state to a heavy load state, for example, the voltage adjusting circuit 1240 may effectively prevent the output voltage VOUT from exceeding the undershoot/overshoot limit resulted in the breakdown of the load unit 1260, and the ripple of the output voltage VOUT is decreased and the stability of the output voltage VOUT is increased. The fourth control circuit 1220 is described below in conjunction with FIG. 13 and FIG. 14.

According to another embodiment of the present invention, the first control circuit 120 shown in FIG. 12 further comprises a first sign converter (not shown) and a second sign converter (not shown). The connection between the analog-to-digital converter 122 and the digital proportional-integral controller 126 is broken. The first sign converter is coupled to the output terminal of the analog-to-digital converter 122 to receive the second internal control signal $D_{ADC}$<b:0>. The first sign converter adds a sign bit to the second internal control signal $D_{ADC}$<b:0>, and then outputs the second internal control signal $D_{ADC}$<b:0> with the added sign bit to the digital proportional-integral controller 126, so as to determine the output voltage VOUT will be pulled up or down. The connection between the digital proportional-integral controller 126 and the voltage adjusting circuit 1240 is broken. The second sign converter is coupled to the output terminal of the digital proportional-integral controller 126 to receive the first control signal $D_{ADC}$<n:0> with the sign bit. The second sign converter deletes the appendant sign bit of the first control signal $D_{ADC}$<n:0>, and then outputs the first control signal $D_{ADC}$<n:0> without the appendant sign bit to the voltage adjusting circuit 1240, so as to support the operation of the voltage adjusting circuit 1240.

Figure 13:
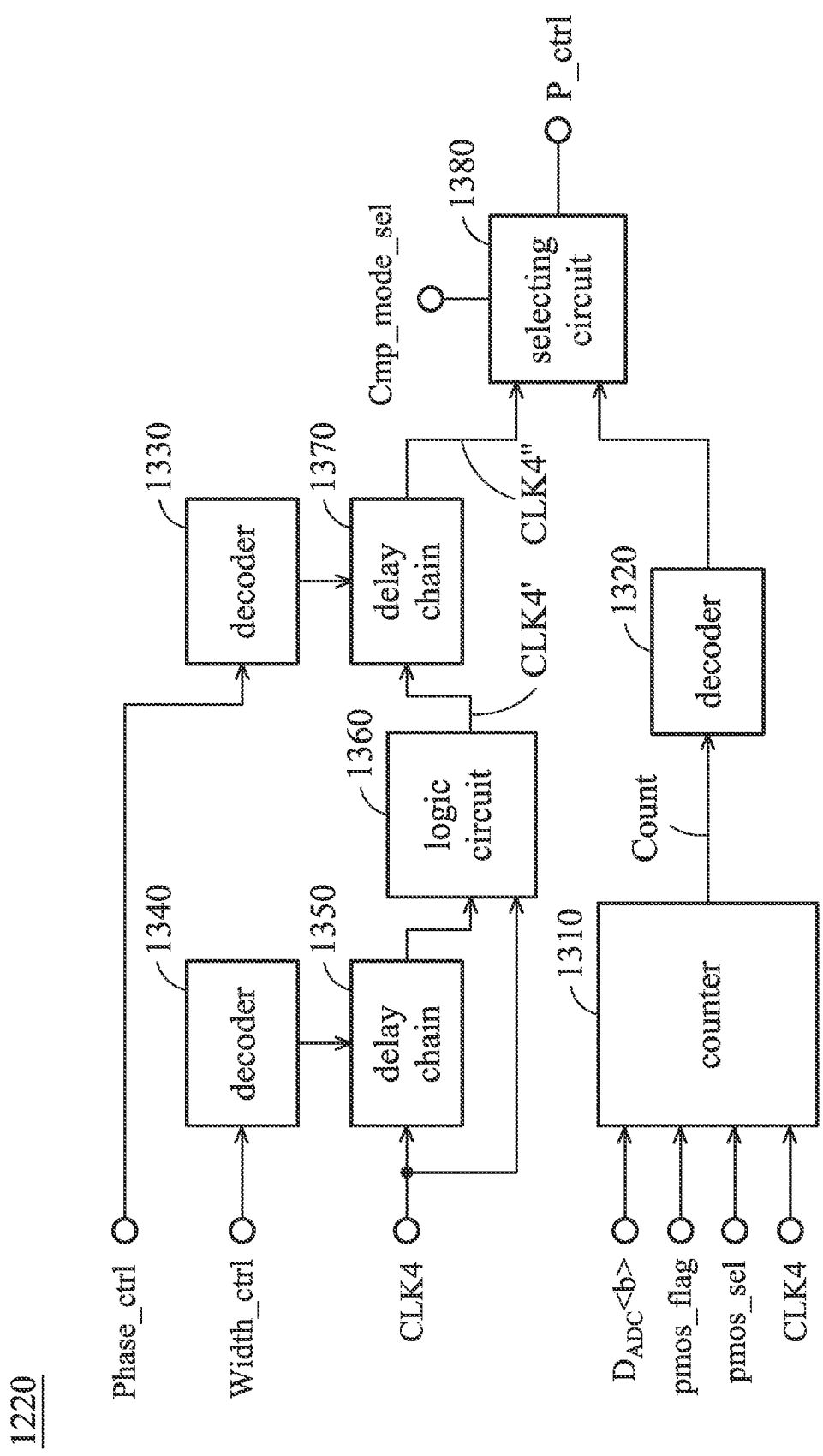
FIG. 13 is a schematic view of a fourth control circuit 1220 according to an embodiment of the present invention.

FIG. 13 is a schematic view of a fourth control circuit 1220 according to an embodiment of the present invention. As shown in FIG. 13, the fourth control circuit 1220 includes a counter 1310, a decoder 1320, a decoder 1330, a decoder 1340, a delay chain 1350, a logic circuit 1360, a delay chain 1370 and a selecting circuit 1380.

The counter 1310 receives the highest bit $D_{ADC}$<b> of the second internal control signal $D_{ADC}$<b:0>, the first flag signal pmos_flag, an initial signal pmos_sel and a clock signal CLK4. When the load unit 1260 is switched from a light load state to a heavy load state, the first flag signal pmos_flag is converted, for example, from the low level to the high level. The counter 1310 performs a down count on the high level of the highest bit $D_{ADC}$<b> of the second internal control signal $D_{ADC}$<b:0> according to the clock signal CLK4 based on the initial signal pmos_sel and generates the counting signal Count. The decoder 1320 is coupled to the counter 1310 to receive the counting signal Count output by the counter 1310, and the decoder 1320 converts the counting signal Count to a thermometer code form.

The decoder 1340 receives a duty-cycle control signal Width_ctrl and converts the duty-cycle control signal Width_ctr to the thermometer code form. The delay chain 1350 is coupled to the decoder 1340 to receive the thermometer code weighed duty-cycle control signal Width_ctrl. The delay chain 1350 further receives the clock signal CLK4. The delay chain 1350 includes a plurality of delay units, wherein each of the delay units receives one bit of the duty cycle control signal Width_ctrl of the thermometer code to determine whether participates in the delay of the clock signal. According to an embodiment of the present invention, the clock signal CLK4 may be a main frequency for driving the load unit 1260.

The logic circuit 1360 includes a first input terminal, a second input terminal and an output terminal. The first input terminal of the logic circuit 1360 is coupled to the output terminal of the delay chain 1350. The second input terminal of the logic circuit 1360 receives the clock signal CLK4. The logic circuit 1360 performs a logic operation on the clock signal CLK4 and the delayed clock signal CLK4 to generate a clock signal CLK4'. The delay chain 1350 and the logic circuit 1360 may be used to adjust the duty cycle of the clock signal CLK4.

The decoder 1330 receives a phase control signal Phase_ctrl and converts the phase control signal Phase_ctrl to the thermometer code form. The delay chain 1370 is coupled to the output terminal of the decoder 1330 to receive the thermometer code weighed phase control signal Phase_ctrl, and the delay chain 1370 is coupled to the output terminal of the logic circuit 1360 to receive the clock signal CLK4'. The delay chain 1370 includes a plurality of delay units, wherein each of the delay units receives one bit of the thermometer code weighed phase control signal Phase_ctrl, to determine whether participates in the delay of the clock signal CLK4'. The delay chain 1370 may be used to adjust the phase of the clock signal CLK4', so as to generate and output the clock signal CLK4".

The selecting unit 1380 includes a first input terminal, a second input terminal and an output terminal. The first input terminal of the selecting unit 1380 is coupled to the delay chain 1370 to receive the clock signal CLK4". The second input terminal of the selecting unit 1380 is coupled to the decoder 1320 to receive the thermometer code weighed counting signal Count. In addition, the selecting unit 1380 further receives a mode control signal cmp_mode_sel. According to the mode control signal cmp_mode_sel, the selecting unit 1380 may select the thermometer code weighed counting signal Count as the fourth control signal P_ctrl, or perform a AND operation on the thermometer code weighed counting signal Count and the clock signal CLK4" and use the result of the AND operation as the fourth control signal P_ctrl, or use "0" as the fourth control signal P_ctrl.

Specifically, when the load unit 1260 is in the light load state, the first flag signal pmos_flag is maintained, for example, at the low level, the selecting unit 1380 uses "0" as the fourth control signal P_ctrl. When the load unit 1260 is switched from the light load state to the heavy load state, the first flag signal pmos_flag is converted from the low level to the high level, and the selecting unit 1380 uses the thermometer code weighed counting signal Count corresponding to the initial signal pmos_sel as the fourth control signal P_ctrl, so as to conduct the transistors of the voltage adjusting circuit 1240. When the load unit 1260 is switched from the heavy load state to the light load state, within a certain duration, the highest bit $D_{ADC}$<b> of the second internal control signal $D_{ADC}$<b:0> is continuously at the high level. The counter 1310 subtracts the count of the highest bit $D_{ADC}$<b> of the high level from the initial signal pmos_sel to generate the counting signal Count. The selecting unit 1380 performs the AND operation on the thermometer code weighed counting signal Count and the clock signal CLK4" and uses the result of the AND operation as the fourth control signal P_ctrl to gradually disconduct the transistors already conducted in the voltage adjusting circuit 1250, so that the output voltage VOUT is restored to its original state. The three scenarios are described below in conjunction with FIG. 14.

Figure 14:
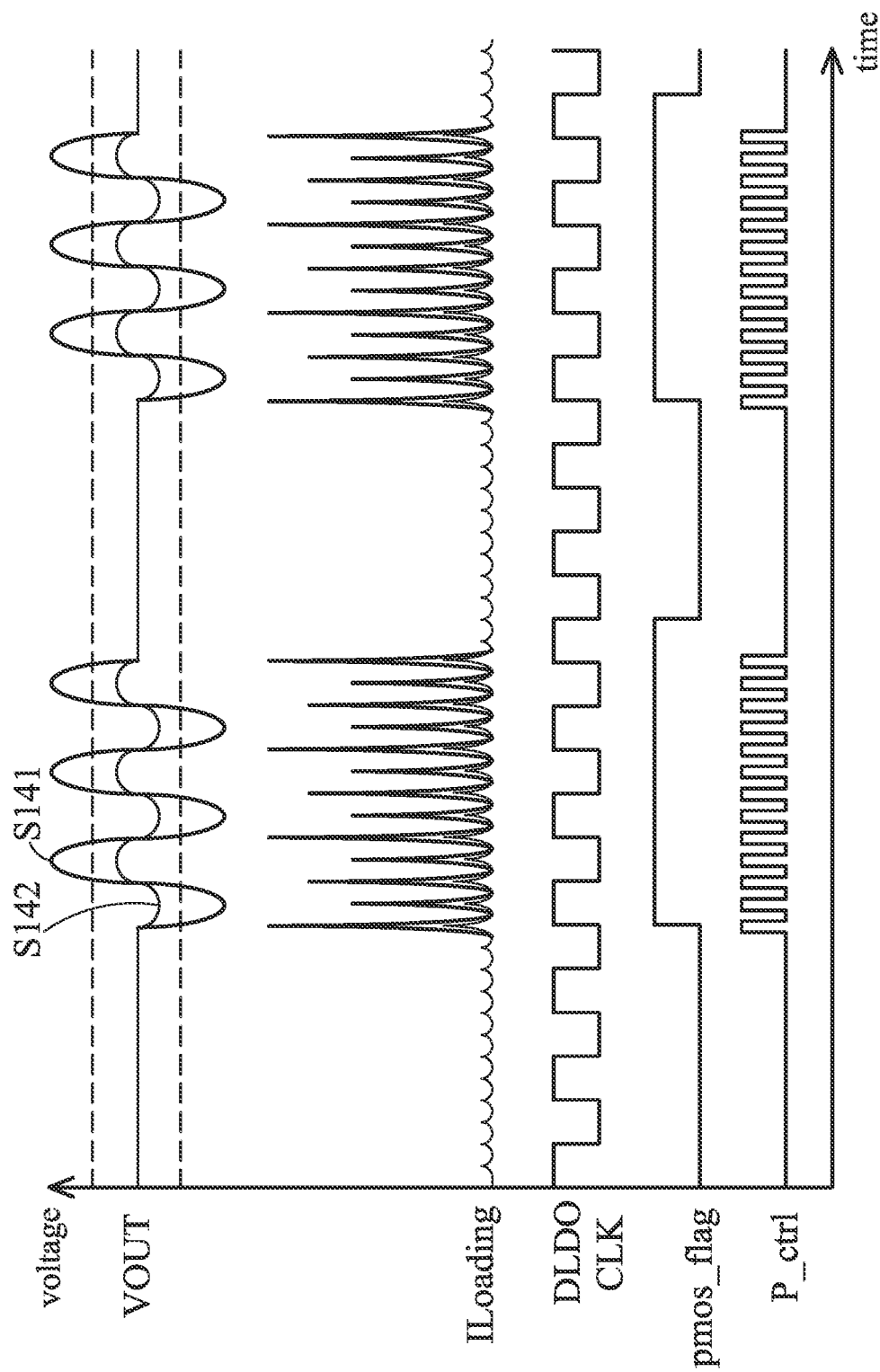
FIG. 14 is a waveform diagram of a first flag signal pmos_flag, a fourth control signal P_ctrl and an output voltage VOUT according to an embodiment of the present invention.

FIG. 14 is a waveform diagram of a first flag signal pmos_flag, a fourth control signal P_ctrl and an output voltage VOUT according to an embodiment of the present invention. Please refer to FIG. 14. A curve S141 represents the output voltage VOUT uncontrolled by the fourth control signal P_ctrl, a curve S142 represents the output voltage VOUT controlled by the fourth control signal P_ctrl, "dashed lines" represent the limits of the undershoot and the overshoot of the output voltage VOUT, and pmos_flag represents the first flag signal.

It can be seen in FIG. 14 that, in an embodiment, when the load unit 1260 is switched from a light load state to a heavy load state, the first flag signal pmos_flag generated by the load unit 1260 is converted, for example, from the low level to the high level. Corresponding to the raising edge of the first flag signal pmos_flag, the number of conducting transistors of the voltage adjusting circuit 1240 is increased according to the fourth control signal P_ctrl, so that the output voltage VOUT is converted from the state shown by curve S141 to the state shown by curve S142, and thereby preventing the output voltage VOUT from exceeding the undershoot or overshoot limit of the output voltage VOUT that may result in a breakdown of the load unit 1260. Then, when the load unit 1260 is switched from the heavy load state to the light load state, the first flag signal pmos_flag generated by the load unit 1260 is converted, for example, from the high level to the low level, so that the output voltage VOUT may be restored from the state of curve S142 to the state of curve S141. According to an embodiment of the present invention, the first flag signal pmos_flag indicating that the load unit has switched from a light load state to a heavy load state may be given by the load unit 1260 before the load state switches. Therefore, FIG. 14 is only used to illustrate how the fourth control signal P_ctrl generated by the fourth control circuit 1220 shown in FIG. 13 affect the state of the output voltage VOUT.

The embodiments shown in FIGS. 12 to 14 may simultaneously suppress the undershoot/overshoot with the longer duration (for example, the duration of the undershoot/overshoot is greater than one clock period of the clock signal CLK), avoid the breakdown caused by the switching load state of the load, and avoid the oscillation between a certain pair of comparison voltages.

Figure 15:
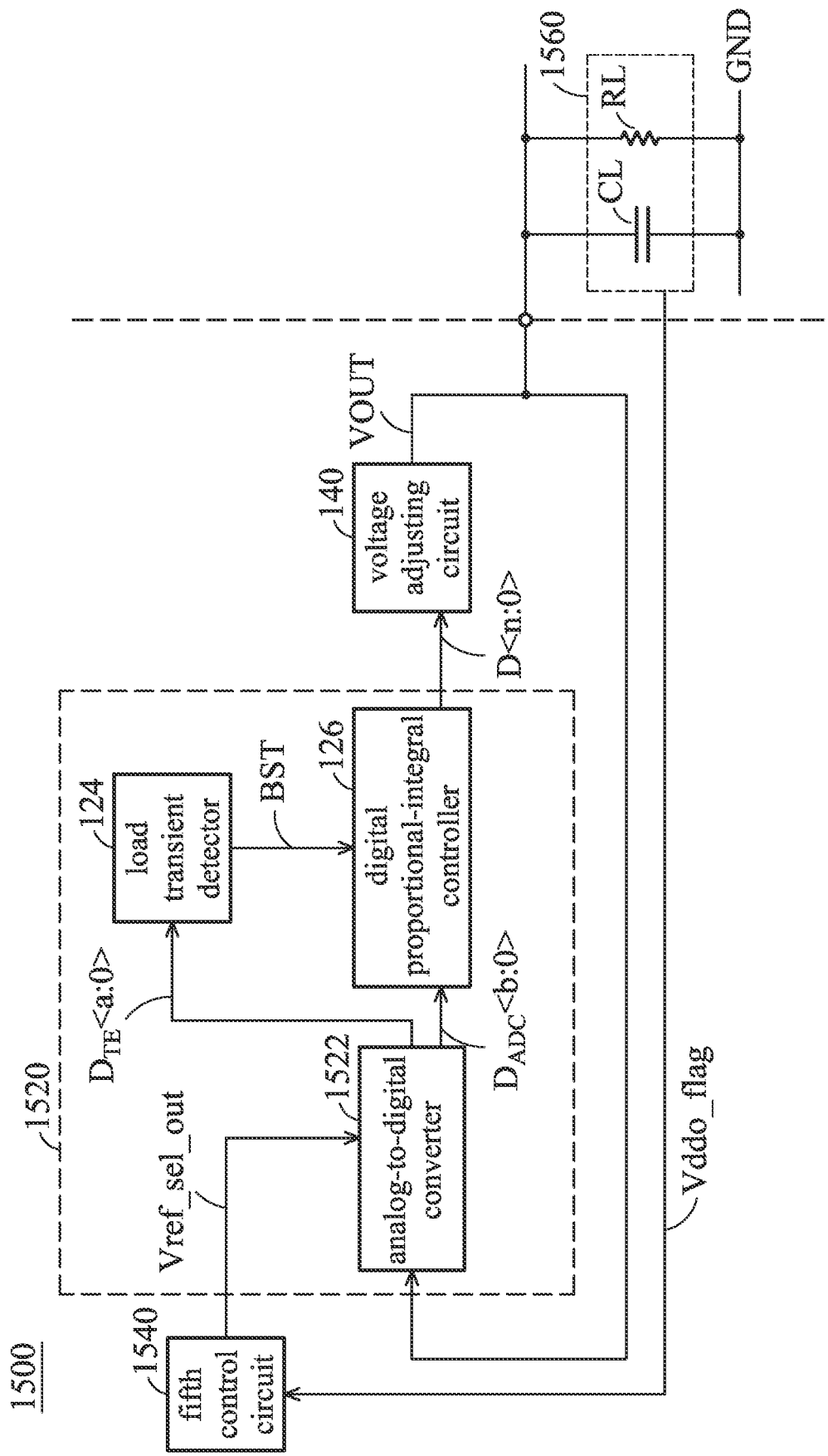
FIG. 15 is a schematic view of a voltage regulator 1500 according to another embodiment of the present invention.

FIG. 15 is a schematic view of a voltage regulator 1500 according to another embodiment of the present invention. Please refer to FIG. 15. The voltage regulator 1500 coupled to a load unit 1560 includes a first control circuit 1520, a voltage adjusting circuit 140 and a fifth control circuit 1540.

In the embodiment, the first control circuit 1520 includes an analog-to-digital converter 1522, a load transient detector 124 and a digital proportional-integral controller 126. The load transient detector 124 and the digital proportional-integral controller 126 are the same as or similar to those described above and may bring about the same technical effect. For details, please to refer to the description of the embodiments of FIG. 1 to FIG. 5, and the description thereof is not repeated herein.

The fifth control circuit 1540 generates a fifth control signal Vref_sel_out according to a second flag signal Vddo_flag provided by the load unit 1560. The fifth control signal Vref_sel_out is output to the analog-to-digital converter 1522 to replace the reference voltage selecting signal Vref_sel received by the reference voltage generator (such as the reference voltage generator 230 above) of the analog-to-digital converter 1522, so as to increase the value of the first control signal D<n:0> to conduct more transistors of the voltage adjusting circuit 140 and increase the output voltage VOUT. The fifth control circuit 1540 is described in detail in conjunction with FIG. 16 and FIG. 17 below.

According to another embodiment of the present invention, the first control circuit 1520 further includes a first sign converter (not shown) and a second sign converter (not shown). The connection between the analog-to-digital converter 1522 and the digital proportional-integral controller 126 is broken. The first sign converter is coupled to the output terminal of the analog-to-digital converter 1522 to receive the second internal control signal $D_{ADC}$<b:0>. The first sign converter adds a sign bit to the second internal control signal $D_{ADC}$<b:0>, and then outputs the second internal control signal $D_{ADC}$<b:0> with the added sign bit to the digital proportional-integral controller 126 to determine the output voltage VOUT will be pulled up or down. The connection between the digital proportional-integral controller 126 and the voltage adjusting circuit 140 is broken. The second sign converter is coupled to the output terminal of the digital proportional-integral controller 126 to receive the first control signal $D_{ADC}$<n:0> with the sign bit, the second sign converter deletes the appendant sign bit of the first control signal $D_{ADC}$<n:0>, and then outputs the first control signal $D_{ADC}$<n:0> without the sign bit to the voltage adjusting circuit 140 to support the operation of the voltage adjusting circuit 140.

Figure 16:
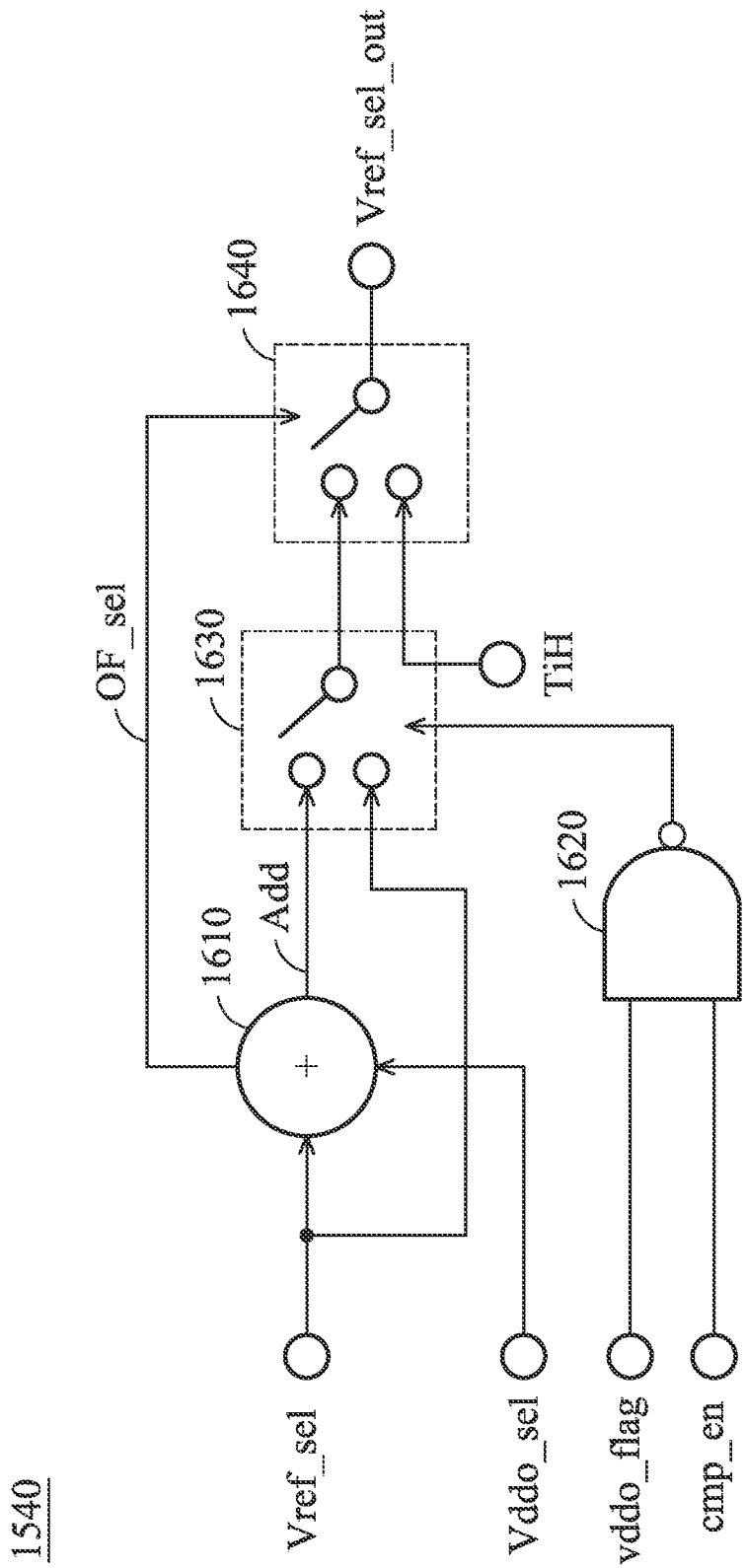
FIG. 16 is a schematic view of a fifth control circuit 1540 according to an embodiment of the present invention.

FIG. 16 is a schematic view of a fifth control circuit 1540 according to an embodiment of the present invention. As shown in FIG. 16, the fifth control circuit 1540 includes an adder 1610, a NAND gate 1620, a selecting circuit 1630 and a selecting circuit 1640. As shown in FIG. 16, the adder 1610 receives the reference voltage selecting signal Vref_sel and an auxiliary voltage selecting signal Vddo_sel, and generates an adding signal Add and an overflow detecting signal OF_sel. The selecting circuit 1630 includes a first input terminal, a second input terminal, a control terminal and an output terminal. The first input terminal of the selecting circuit 1630 is coupled to an output terminal of the adder 1610 to receive the adding signal Add. The second input terminal of the selecting circuit 1630 receives the reference voltage selecting signal Vref_sel. The control terminal of the selecting circuit 1630 is coupled to an output terminal of the NAND gate 1620. The NAND gate 1620 includes a first input terminal, a second input terminal and the output terminal. The first input terminal of the NAND gate 1620 receives the second flag signal Vddo_flag. The second input terminal of the NAND gate 1620 receives a compensation start signal cmp_en. The selecting circuit 1640 includes a first input terminal, a second input terminal, a control terminal and an output terminal. The first input terminal of the selecting circuit 1640 is coupled to the output terminal of the selecting circuit 1630. The second input terminal of the selecting circuit 1640 receives a signal TiH, wherein the signal TiH is, for example, constantly at the high level. The control terminal of the selecting circuit 1640 is coupled to an output terminal of the adder 1610 to receive the overflow detecting signal OF_sel. The output terminal of the selecting circuit 1640 outputs the fifth control signal Vref_sel_out.

The adder 1610 adds the reference voltage selecting signal Vref_sel and the auxiliary voltage selecting signal Vddo_sel to generate the adding signal Add. When the number of bits of the adding signal Add exceeds the number of bits of the reference voltage selecting signal Vref_sel, the overflow detecting signal OF_sel is converted, for example, from the low level to the high level. At this time, the overflow detecting signal OF_sel of high level controls the selecting circuit 1640 to output the signal TiH as the fifth control signal Vref_sel_out, so that each bit of the fifth control signal Vref_sel_out is "1", and the reference voltage generator of the analog-to-digital converter 1522 directly outputs a reference voltage with the maximum value. Herein, the number of bits of the reference voltage selecting signal Vref_sel is greater than or equal to the number of bits of the auxiliary voltage selecting signal Vddo_sel, and the auxiliary voltage selecting signal Vddo_sel is used to raise the reference voltage selecting signal Vref_sel to the fifth control signal Vref_sel_out. When the number of bits of the adding signal Add does not exceed the number of bits of the reference voltage selecting signal Vref_sel, under the control of the output signal of the NAND gate 1620, the selecting circuit 1630 outputs the adding signal Add or the reference voltage selecting signal Vref_sel. For example, under the control of the low-level overflow detecting signal OF_sel, the selecting circuit 1640 uses the adding Add or the reference voltage selecting signal Vref_sel as the fifth control signal Vref_sel_out. This is described further in conjunction with FIG. 17 below.

Figure 17:
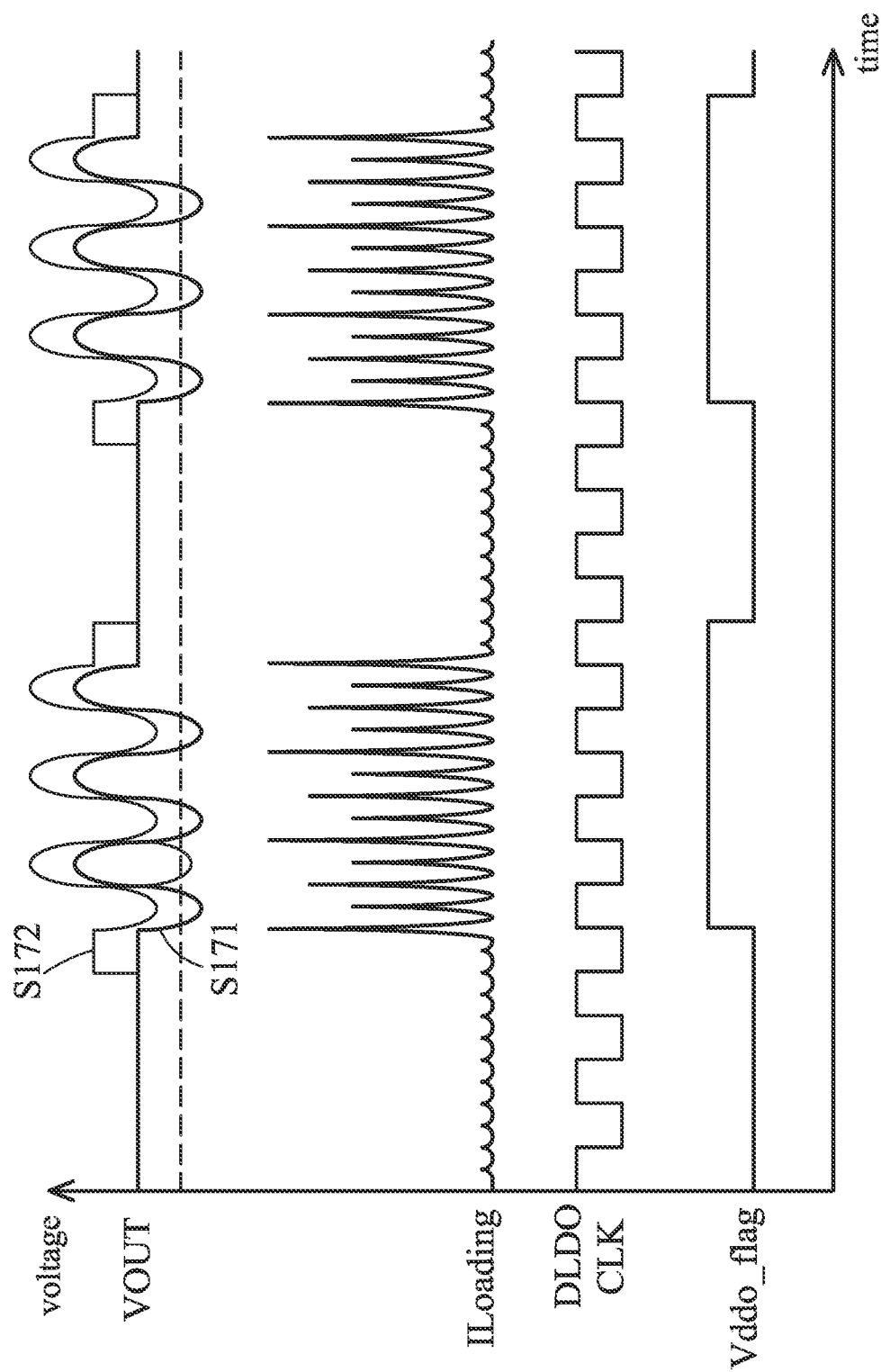
FIG. 17 is a waveform diagram of a second flag signal Vddo_flag and an output voltage VOUT according to an embodiment of the present invention.

FIG. 17 is a waveform diagram of a second flag signal Vddo_flag and an output voltage VOUT according to an embodiment of the present invention. Please refer to FIG. 17. A curve S171 represents the output voltage VOUT uncontrolled by the fifth control signal Vref_sel_out, a curve S172 represents the output voltage VOUT controlled by the fifth control signal Vref_sel_out, and a "dashed line" represents the limit of the undershoot of the output voltage VOUT.

It can be seen in FIG. 17 that when the load unit 1560 is switched from a light load state to a heavy load state, the second flag signal Vddo_flag generated by the load unit 1560 is converted to the high level. Corresponding to the raising edge of the second flag signal Vddo_flag, the selecting circuit 1640 uses the adding signal Add as the fifth control signal Vref_sel_out, to increase the first control signal D<n:0> through the manner of controlling the reference voltage of the analog-to-digital converter 1522, so as to increase the number of conducting transistors of the voltage adjusting circuit 140. The output voltage VOUT is directly adjusted from the state shown by the curve S171 to the state shown by the curve S172, i.e., the output voltage VOUT is raised by a certain level value, thereby preventing the output voltage VOUT from being lower than the undershoot limit resulted in breakdown of the load unit 1560. Correspondingly, when the load unit 1560 is switched from the heavy load state to the light load state, the second flag signal Vddo_flag generated by the load unit 1560 is converted to the low level. The selecting signal 1640 uses the reference voltage selecting signal Vref_sel as the fifth control signal Vref_sel_out, restoring the output voltage VOUT to the state of curve S171 from the state of curve S172. According to an embodiment of the present invention, the second flag signal Vddo_flag indicating that the load unit has switched from a light load state to a heavy load state may be given by the load unit 1560 before the load state switches. Therefore, FIG. 17 is only used to illustrate how the fifth control signal Vref_sel_out generated by the fifth control circuit 1540 shown in FIG. 16 affect the state of the output voltage VOUT.

The embodiments shown in FIGS. 15 to 17 may also simultaneously suppress the undershoot/overshoot with the longer duration (for example, the duration of the undershoot/overshoot is greater than one clock period of the clock signal CLK), avoid the breakdown caused by the switching load state of the load, and avoid the oscillation between a certain pair of comparison voltages.

Figure 18:
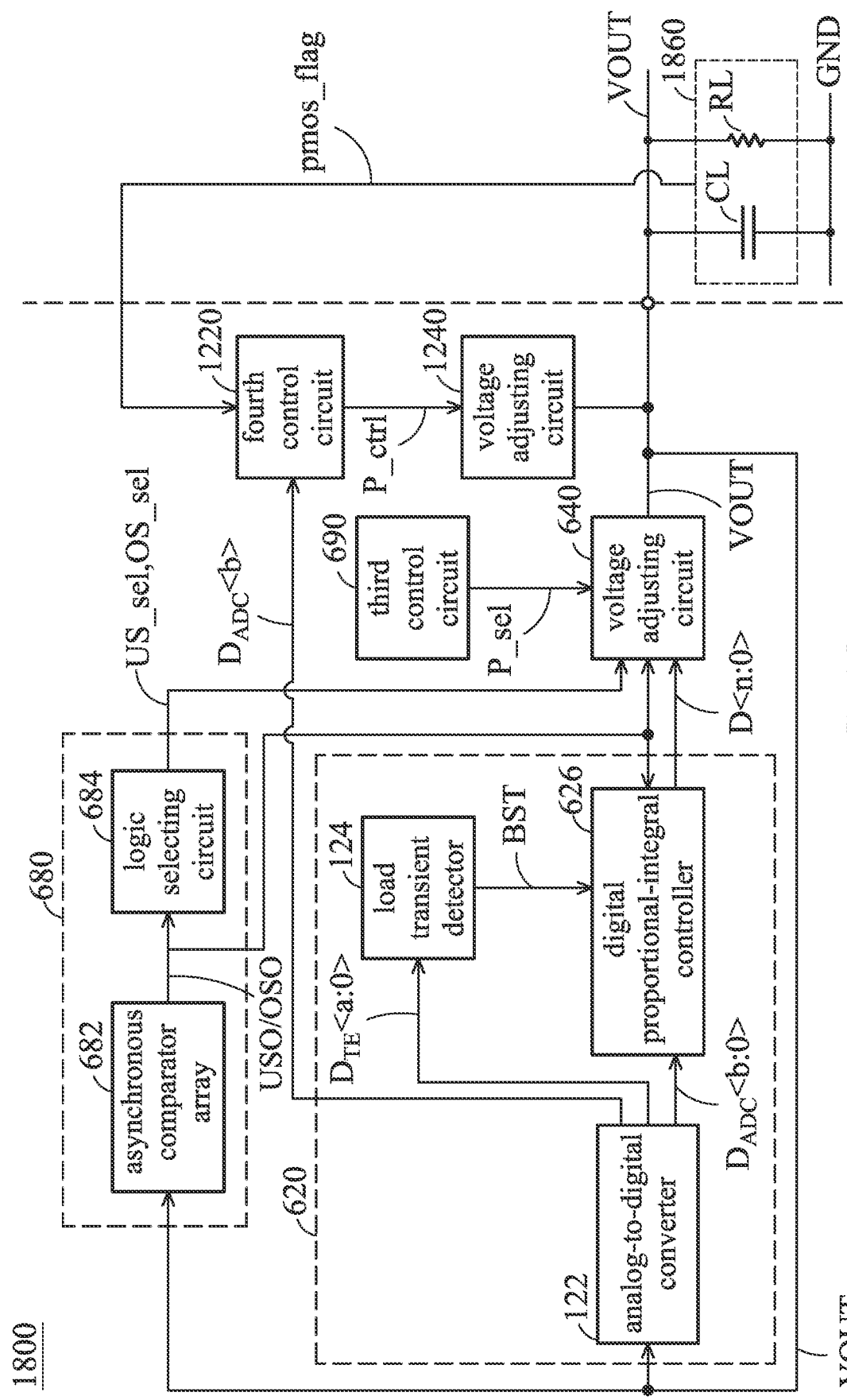
FIG. 18 is a schematic view of a voltage regulator 1800 according to another embodiment of the present invention.

FIG. 18 is a schematic view of a voltage regulator 1800 according to another embodiment of the present invention. Please refer to FIG. 18. The voltage regulator 1800 coupled to a load unit 1860 includes a first control circuit 620, a voltage adjusting circuit 640, a second control circuit 680, a third control circuit 690, a fourth control circuit 1220 and a voltage adjusting circuit 1240.

In the embodiment, the first control circuit 620, the voltage adjusting circuit 640, the second control circuit 680, the third control circuit 690 and the respective internal structure thereof in FIG. 18 are the same as or similar to that shown in FIGS. 6 to 11. The fourth control circuit 1220 and the voltage adjusting circuit 1240 in FIG. 18 are the same as or similar to that shown in FIGS. 12 to 14. Accordingly, the embodiment of FIG. 18 may refer to the description of the embodiments of FIGS. 6-14, and the description thereof is not repeated herein.

The voltage regulator 1800 of the embodiment of FIG. 18 may roughly and finely adjust the undershoot/overshoot of the output voltage VOUT with longer duration (for example, the duration of the undershoot/overshoot is greater than one clock period of the clock signal CLK) and shorter duration (for example, the duration of the undershoot/overshoot is less than one clock period of the clock signal CLK), avoid the breakdown when the load unit 1860 suddenly switches the load state, and avoid the oscillation between a certain pair of comparison voltages.

According to another embodiment of the present invention, the first control circuit 620 shown in FIG. 18 further includes a first sign converter (not shown) and a second sign converter (not shown). The connection between the analog-to-digital converter 122 and the digital proportional-integral controller 626 is broken. The first sign converter is coupled to the output terminal of the analog-to-digital converter 122 to receive the second internal control signal $D_{ADC}<b:0>$. The first sign converter adds a sign bit to the second internal control signal $D_{ADC}<b:0>$, and then outputs the second internal control signal $D_{ADC}<b:0>$ with the added sign bit to the digital proportional-integral controller 626 to determine the output voltage VOUT will be pulled up or down. The connection between the digital proportional-integral controller 626 and the voltage adjusting circuit 640 is broken. The second sign converter is coupled to the output terminal of the digital proportional-integral controller 626 to receive the first control signal $D_{ADC}<n:0>$ with the sign bit. The second sign converter deletes the appendant sign bit of the first control signal $D_{ADC}<n:0>$, and then outputs the first control signal $D_{ADC}<n:0>$ without the sign bit to the voltage adjusting circuit 640 to support the operation of the voltage adjusting circuit 640.

Figure 19:
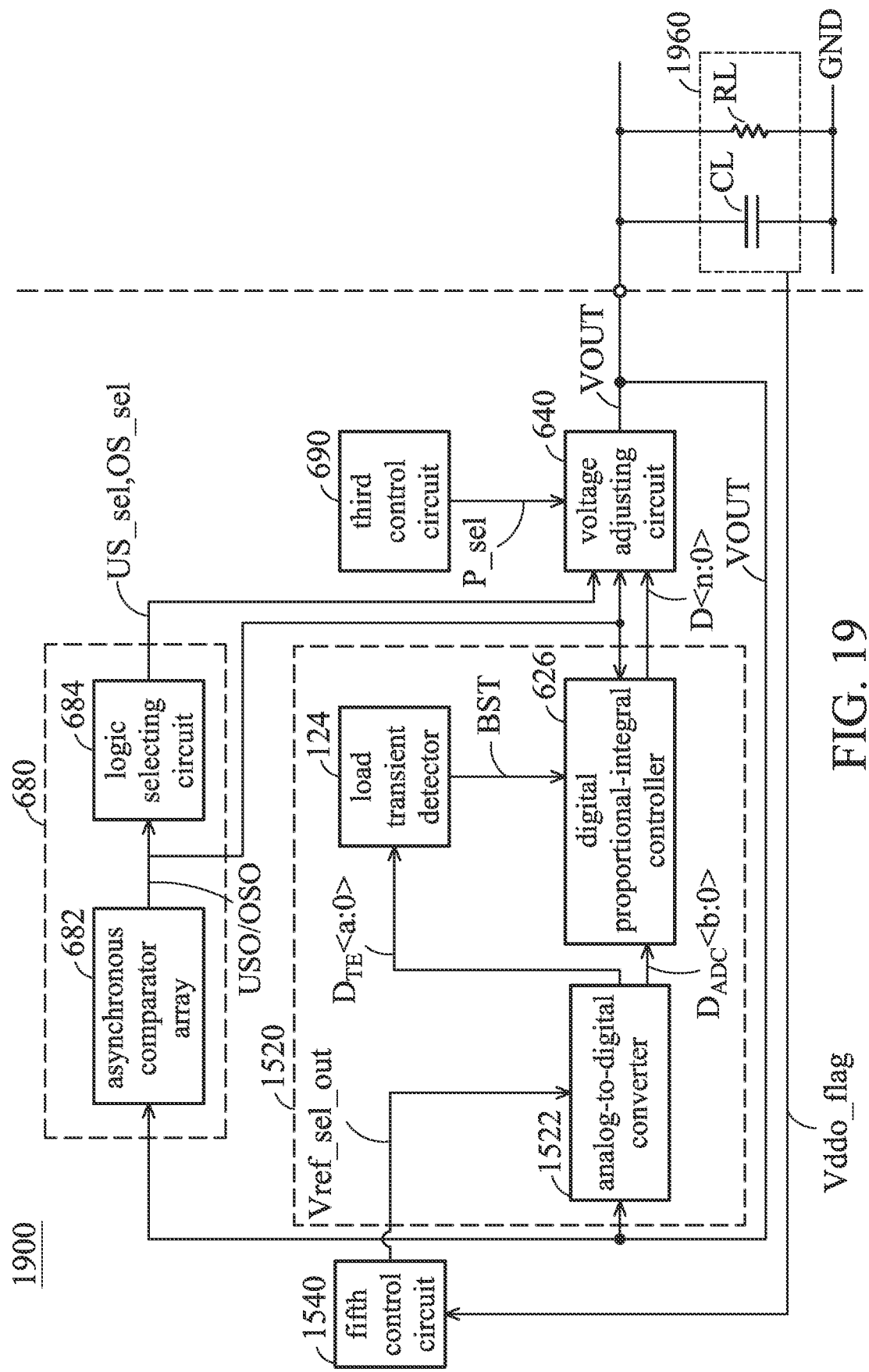
FIG. 19 is a schematic view of a voltage regulator 1900 according to another embodiment of the present invention.

FIG. 19 is a schematic view of a voltage regulator 1900 according to another embodiment of the present invention. Please to refer to FIG. 19. The voltage regulator 1900 coupled to a load unit 1960 includes a first control circuit 1520, a second control circuit 680, a third control circuit 690, a fifth control circuit 1540 and a voltage adjusting circuit 640.

In the embodiment, the voltage adjusting circuit 640, the second control circuit 680, the third control circuit 690 and the respective internal structure thereof are the same as or similar to that shown in FIGS. 6 to 11. The first control circuit 1520, the fifth control circuit 1540 and the respective internal structure in FIG. 19 are the same as or similar to that shown in FIGS. 15~17. Accordingly, the embodiment of FIG. 19 may refer to the description of the embodiments of FIGS. 6~11 and FIGS. 15~17, and the description thereof is not repeated herein.

The voltage regulator 1900 of the embodiment of FIG. 19 may roughly and finely adjust the undershoot/overshoot of the output voltage VOUT with longer duration (for example, the duration of the undershoot/overshoot is greater than one clock period of the clock signal CLK) and shorter duration (for example, the duration of the undershoot/overshoot is less than one clock period of the clock signal CLK), avoid the breakdown when the load unit 1960 suddenly switches the load state, and avoid the oscillation between a certain pair of comparison voltages.

According to another embodiment of the present invention, the first control circuit 1520 shown in FIG. 19 further comprises a first sign converter (not shown) and a second sign converter (not shown). The connection between the analog-to-digital converter 1522 and the digital proportional-integral controller 626 is broken. The first sign converter is coupled to the output terminal of the analog-todigital converter 1522 to receive the second internal control signal $D_{ADC}$<b:0>. The first sign converter adds a sign bit to the second internal control signal $D_{ADC}$<b:0>, and then outputs the second internal control signal $D_{ADC}$<b:0> with the added sign bit to the digital proportional-integral controller 626 to determine the output voltage VOUT will be pulled up or down. The connection between the digital proportional-integral controller 626 and the voltage adjusting circuit 640 is broken. The second sign converter is coupled to the output terminal of the digital proportional-integral controller 626 to receive the first control signal $D_{ADC}$<n:0> with the sign bit. The second sign converter deletes the appendant sign bit of the first control signal $D_{ADC}$<n:0>, and then outputs the first control signal $D_{ADC}$<n:0> without the sign bit to the voltage adjusting circuit 640 to support the operation of the voltage adjusting circuit 640.

In summary, according to the voltage regulator disclosed by the present invention, the first control circuit generates the first control signal according to the output voltage, so that the first voltage adjusting circuit generates a stable output voltage to the load circuit according to the first control signal, thereby effectively avoiding the problem of power waste and decreasing the overall power consumption of the circuit.

In addition, the embodiment of the present invention further includes the second control circuit and the third control circuit. The first voltage adjusting circuit is controlled by the second control circuit and the third control circuit to adjust the output voltage, thereby effectively solving the problem of the undershoot or the overshoot of the output voltage. Furthermore, the embodiment of the present invention may further include the fourth control circuit and a second voltage adjusting circuit, and the second voltage adjusting circuit is controlled by the fourth control circuit to adjust the output voltage, so that when the state of the load unit is switched (for example, from a light load state to a heavy load state), the fourth control circuit may effectively prevent the voltage from exceeding the overshoot and undershoot limits that may result in a breakdown of the load unit under a heavy load. The ripple of the output voltage is decreased and the stability of the output voltage is increased. Moreover, the embodiment of the present invention may further include the fifth control circuit, the fifth control circuit can increase the first control signal, so that when the state of the load unit is switched (for example, from a light load state to a heavy load state), the fifth control circuit may effectively prevent the voltage from exceeding the overshoot and undershoot limits, which would result in a breakdown of the load unit under a heavy load state. The ripple of the output voltage is decreased and the stability of the output voltage is increased. According to an embodiment of the present invention, the voltage regulator disclosed by the embodiment of the present invention is suitable to supply power to all load units that may affect the output voltage of the voltage regulator. According to an embodiment of the present invention, the voltage regulator may be a low dropout voltage regulator.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A voltage regulator, coupled to a load unit, wherein the voltage regulator generates an output voltage according to the load unit, the voltage regulator comprises:
    a first control circuit, configured to receive the output voltage, and generate a first control signal according to the output voltage; and
    a first voltage adjusting circuit, coupled to the first control circuit, and configured to receive the first control signal and adjust the output voltage according to the first control signal;
    wherein the first control circuit comprises:
    an analog-to-digital converter, configured to receive the output voltage to generate a first internal control signal and a second internal control signal;
    a load transient detector, coupled to the analog-to-digital converter, and configured to receive the first internal control signal to generate a detecting signal; and
    a digital proportional-integral controller, configured to receive the second internal control signal and the detecting signal, and perform a proportional-integral operation on the second internal control signal according to the detecting signal, so as to generate the first control signal.

2. The voltage regulator as claimed in claim 1, wherein the first control circuit further comprises:
    a first sign converter, coupled to the analog-to-digital converter, and configured to receive the second internal control signal, and add a sign bit to the second internal control signal to indicate an adjustment direction of the output voltage;
    a second sign converter, coupled to the digital proportional-integral controller, and configured to receive the first control signal with the sign bit and remove the sign bit.

3. The voltage regulator as claimed in claim 1, wherein the analog-to-digital converter comprises:
    a plurality of comparators, wherein each of the plurality of comparators compares the output voltage with one of a plurality of first sub-reference voltages to generate a plurality of thermometer codes, and uses a middle bit of the plurality of thermometer codes and equally spaced bits before and after the middle bit as the first internal control signal; and
    a decoder, coupled to a plurality of output terminals of the plurality of comparators, and configured to receive the plurality of thermometer codes and convert the plurality of thermometer codes to the first internal control signal.

4. The voltage regulator as claimed in claim 1, wherein the load transient detector comprises:
    a first inverter, comprising an input terminal and an output terminal, wherein the input terminal of the first inverter receives a first bit signal of the first internal control signal, and the first inverter inverts the first bit signal;
    a first delayer, comprising an input terminal and an output terminal, wherein the input terminal of the first delayer receives a second bit signal of the first internal control signal, and the first delayer delays the second bit signal;
    a second inverter, comprising an input terminal and an output terminal, wherein the input terminal of the second inverter receives the second bit signal, and the second inverter inverts the second bit signal;
    a second delayer, comprising an input terminal and an output terminal, wherein the input terminal of the second delayer receives a third bit signal of the first internal control signal, and the third delayer delays the third bit signal;

a first flip-flop, comprising a first input terminal, a second input terminal and a first output terminal, wherein the first input terminal of the first flip-flop is coupled to the output terminal of the first inverter, and the second input terminal of the first flip-flop is coupled to the output terminal of the first delayer;

a second flip-flop, comprising a first input terminal, a second input terminal and a second output terminal, wherein the first input terminal of the second flip-flop is coupled to the output terminal of the second inverter, and the second input terminal of the second flip-flop is coupled to the output terminal of the second delayer; and a XOR gate, comprising a first input terminal, a second input terminal and an output terminal, wherein the first input terminal of the XOR gate is coupled to the first output terminal of the first flip-flop, the second input terminal of the XOR gate is coupled to the second output terminal of the second flip-flop, and the XOR gate generates the detecting signal and outputs the detecting signal through the output terminal of the XOR gate.

5. The voltage regulator as claimed in claim 1, wherein the digital proportional-integral controller comprises:

a first shifter, configured to receive the second internal control signal and the detecting signal to generate a first shifting signal;

a second shifter, configured to receive the second internal control signal and the detecting signal to generate a second shifting signal;

a first adder, coupled to the second shifter, and configured to receive the second shifting signal and a first adding signal to generate a second adding signal;

a register, coupled to the first adder, and configured to receive the second adding signal to generate the first adding signal; and a second adder, coupled to the first shifter and the register, and configured to receive the first shifting signal and the first adding signal to generate the first control signal.

6. The voltage regulator as claimed in claim 1, further comprising:

a fourth control circuit, coupled to the load unit to receive a first flag signal, and coupled to the analog-to-digital converter to receive a highest bit of the second internal control signal, and configured to generate a fourth control signal according to the first flag signal and the highest bit of the second internal control signal; and a second voltage adjustment circuit, coupled to the fourth control circuit, and configured to receive the fourth control signal to adjust the output voltage.

7. The voltage regulator as claimed in claim 5, wherein the fourth control circuit comprises:

a counter, configured to receive the highest bit of the second internal control signal, the first flag signal, an initial signal and a first clock signal, wherein under the instruction of the first flag signal and the driving of the first clock signal, the counter subtracts a counting of the highest bit of the second internal control signal at a first level from the initial signal to generate a counting signal;

a first decoder, coupled to the counter, and configured to receive the counting signal to generate a first decoding signal;

a second decoder, configured to receive a phase control signal to generate a second decoding signal;

a third decoder, configured to receive a duty-cycle control signal to generate a third decoding signal;

a first delay chain, coupled to the third decoder, and configured to receive the third decoding signal and the first clock signal, wherein the first delay chain delays the first clock signal under control of the third decoding signal;

a logic circuit, comprising a first input terminal, a second input terminal and an output terminal, wherein the first input terminal of the logic circuit is coupled to an output terminal of the first delay chain, the second input terminal of the logic circuit receives the first clock signal, and the output terminal of the logic circuit outputs a second clock signal;

a second delay chain, coupled to the output terminal of the second decoder to receive the second decoding signal, and coupled to the output terminal of the logic circuit to receive the second clock signal, wherein the second delay chain generates a third clock signal;

a selecting unit, coupled to the second delay chain and the first decoder, wherein the selecting unit receives a mode control signal, the first decoding signal and the third clock signal, and selects the first decoding signal, or an ADD operation result of the first decoding signal and the third clock signal, or a second level as the fourth control signal according to the mode control signal.

8. The voltage regulator as claimed in claim 1, further comprising a fifth control circuit, wherein the fifth control circuit is coupled to the load unit to receive a second flag signal and generate a fifth control signal according to the second flag signal, the fifth control circuit comprises:

an adder, configured to receive a reference voltage selecting signal and an auxiliary voltage selecting signal to generate an adding signal and an overflow detecting signal;

a NAND gate, comprising a first input terminal, a second input terminal and an output terminal, wherein the first input terminal of the NAND gate receives the second flag signal, and the second input terminal of the NAND gate receives a compensation start signal;

a first selecting circuit, comprising a first input terminal, a second input terminal, a control terminal and an output terminal, wherein the first input terminal of the first selecting circuit is coupled to the adder to receive the adding signal, the second input terminal of the first selecting circuit receives the reference voltage selecting signal, and the control terminal of the first selecting circuit is coupled to the output terminal of the NAND gate; and a second selecting circuit, comprising a first input terminal, a second input terminal, a control terminal and an output terminal, wherein the first input terminal of the second selecting circuit is coupled to the output terminal of the first selecting circuit, the second input terminal of the second selecting circuit receives a fixed signal, the control terminal of the second selecting circuit is coupled to the adder to receive the overflow detecting signal, and the second selecting circuit generates the fifth control signal and outputs the fifth control signal through the output terminal of the second selecting circuit.

9. The voltage regulator as claimed in claim 1, further comprising a second control circuit, wherein the second control circuit receives the output voltage and generates a plurality of protection signals, a first selecting signal and a second selecting signal according to the output voltage, the second control circuit comprises:
- an asynchronous comparator array, configured to receive the output voltage, to generate the plurality of protection signals and provide the plurality of protection signals to the first control circuit and the first voltage adjusting circuit; and
- a selecting logic circuit, coupled to the asynchronous comparator array and the first voltage adjusting circuit, and configured to receive the plurality of protection signals to generate the first selecting signal and the second selecting signal, and provide the first selecting signal and the second selecting signal to the first voltage adjusting circuit.

10. The voltage regulator as claimed in claim 9, wherein the asynchronous comparator array comprises:
- a first comparator group, comprising a plurality of comparators, wherein each of the plurality of comparators in the first comparator group compares the output voltage with a first comparison voltage to generate a plurality of first sub-protection signals of the plurality of protection signals; and
- a second comparator group, comprising a plurality of comparators, wherein each of the plurality of comparators in the second comparator group compares the output voltage with a second comparison voltage to generate a plurality of second sub-protection signals of the plurality of protection signals.

11. The voltage regulator as claimed in claim 10, wherein the selecting logic circuit comprises:
- a first logic module, comprising a first input terminal, a second input terminal and an output terminal, wherein the first input terminal of the first logic module receives a first signal of the plurality of first sub-protection signals, and the second input terminal of the first logic module receives the second selecting signal;
- a second logic module, comprising a first input terminal, a second input terminal and an output terminal, wherein the first input terminal of the second logic module receives a first signal of the plurality of second sub-protection signals, and the second input terminal of the second logic module receives the first selecting signal;
- a third logic module, comprising a first input terminal, a second input terminal and an output terminal, wherein the first input terminal of the third logic module receives a second signal of the first sub-protection signals, and the second input terminal of the third logic module receives a reset signal;
- a fourth logic module, comprising a first input terminal, a second input terminal and an output terminal, wherein the first input terminal of the fourth logic module receives a second signal of the plurality of second sub-protection signals, and the second input terminal of the fourth logic module receives the reset signal;
- a plurality of first flip-flops, each of the plurality of first flip-flops comprising a first input terminal, a second input terminal, a third input terminal, a fourth input terminal, and an output terminal, wherein the first input terminal of a first one of the plurality of first flip-flops receives a fixed signal, the first input terminal of another one of the plurality of flip-flops is coupled to the output terminal of a previous one of the plurality of first flip-flops, the second input terminal of each of the plurality of first flip-flops receives a clock signal, the third input terminal of each of the plurality of first flip-flops is coupled to the output terminal of the first logic module, and the fourth input terminal of each of the plurality of first flip-flops is coupled to the output terminal of the third logic module;
- a plurality of second flip-flops, each of the plurality of first flip-flops comprising a first input terminal, a second input terminal, a third input terminal, a fourth input terminal and an output terminal, wherein the first input terminal of a first one of the plurality of second flip-flops receives the fixed signal, the first input terminal of another one of the plurality of second flip-flops is coupled to the output terminal of a previous one of the plurality of second flip-flops, the second input terminal of each of the plurality of second flip-flops receives the clock signal, the third input terminal of each of the plurality of second flip-flops is coupled to the output terminal of the second logic module, and the fourth input terminal of each of the plurality of second flip-flops is coupled to the output terminal of the fourth logic module;
- a fifth logic module, comprising a first input terminal, a second input terminal and an output terminal, wherein the first input terminal of the fifth logic module is coupled to the output terminal of a last one of the plurality of first flip-flops, the second input terminal of the fifth logic module receives the reset signal, and the output terminal of the fifth logic module outputs the first selecting signal; and
- a sixth logic module, comprising a first input terminal, a second input terminal and an output terminal, wherein the first input terminal of the sixth logic module is coupled to the output terminal of the last one of the plurality of second flip-flops, the second input terminal of the sixth logic module receives the reset signal, and the output terminal of the sixth logic module outputs the second selecting signal.

12. The voltage regulator as claimed in claim 11, further comprising a third control circuit, wherein the third control circuit generates a third control signal, the third control circuit comprises:
- a digital comparison logic circuit, configured to receive a reference voltage selecting signal and a reference code signal to generate a control signal;
- a first selecting circuit, comprising an input terminal, a first output terminal, a second output terminal and a control terminal, wherein the control terminal of the first selecting circuit receives a mode switching signal;
- a second selecting circuit, comprising a first input terminal, a second input terminal, an output terminal and a control terminal, wherein the control terminal of the second selecting circuit receives the mode switching signal;
- a first transistor group, coupled to the first output terminal of the first selecting circuit;
- an analog load, coupled to the first transistor group;
- a second transistor group, coupled to the second output terminal of the first switching circuit;
- a digital load, coupled to the second transistor group;
- a comparator, comprising a first input terminal, a second input terminal and an output terminal, wherein the first input terminal of the comparator is coupled to the output terminal of the second selecting circuit, and the second input terminal of the comparator receives a reference voltage;
- a logic circuit, coupled to the output terminal of the comparator and the input terminal of the first selecting circuit, wherein the logic circuit outputs the third control signal.

13. The voltage regulator as claimed in claim 12, wherein the first voltage adjusting circuit comprises a plurality of voltage adjusting sub-circuits, and each of the plurality of voltage adjusting sub-circuits comprises:

a seventh logic module, comprising a first input terminal, a second input terminal, a third input terminal and an output terminal, wherein the first input terminal of the seventh logic module receives a first protection signal, the second input terminal of the seventh logic module receives the first selecting signal, and the third input terminal of the seventh logic module receives an inverted signal of the third control signal;

an eighth logic module, comprising a first input terminal, a second input terminal, a third input terminal and an output terminal, wherein the first input terminal of the eighth logic module receives a second protection signal, the second input terminal of the eighth logic module receives the second selecting signal, and the third input terminal of the eighth logic module receives the third control signal;

a plurality of ninth logic modules, each of the plurality of ninth logic modules comprising a first input terminal, a second input terminal, a third input terminal and an output terminal, wherein the first input terminal of each of the plurality of ninth logic modules receives a bit of the first control signal, the second input terminal of each of the plurality of ninth logic modules is coupled to the output terminal of the seventh logic module, and the third input terminal of each of the plurality of ninth logic modules is coupled to the output terminal of the eighth logic module;

a plurality of transistor groups, each of the plurality of transistor groups comprising a first terminal, a second terminal and a third terminal, wherein the first terminal of each of the plurality of transistor groups is coupled to an operation voltage, the second terminal of each of the plurality of transistor groups is coupled to the output terminal of corresponding one of the plurality of ninth logic modules, and the third terminal of each of the plurality of transistor groups is coupled to the output voltage.

* * * * *